United States Patent
Lee et al.

(10) Patent No.: US 11,393,848 B2
(45) Date of Patent: Jul. 19, 2022

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Kun Young Lee, Icheon-si (KR); Changhan Kim, Icheon-si (KR); Sung Hyun Yoon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/151,559

(22) Filed: Jan. 18, 2021

(65) Prior Publication Data
US 2022/0020773 A1 Jan. 20, 2022

(30) Foreign Application Priority Data
Jul. 15, 2020 (KR) .................... 10-2020-0087832

(51) Int. Cl.
| H01L 27/11597 | (2017.01) |
| H01L 27/1159 | (2017.01) |
| H01L 27/11587 | (2017.01) |
| H01L 27/11578 | (2017.01) |
| H01L 29/51 | (2006.01) |
| H01L 27/11582 | (2017.01) |

(52) U.S. Cl.
CPC .... *H01L 27/11597* (2013.01); *H01L 27/1159* (2013.01); *H01L 27/11578* (2013.01); *H01L 27/11582* (2013.01); *H01L 27/11587* (2013.01); *H01L 29/515* (2013.01); *H01L 29/516* (2013.01)

(58) Field of Classification Search
CPC ......... H01L 27/11578; H01L 27/11582; H01L 27/11587; H01L 27/1159; H01L 27/11597; H01L 29/515; H01L 29/516
See application file for complete search history.

(56) References Cited

U.S. PATENT DOCUMENTS

| 9,831,118 B1 * | 11/2017 | Pang ................ H01L 21/76816 |
| 10,032,935 B2 | 7/2018 | Higuchi et al. |
| 10,340,286 B2 | 7/2019 | Goda et al. |
| 10,438,962 B2 | 10/2019 | Kim |

(Continued)

FOREIGN PATENT DOCUMENTS

CN 113316848 A * 8/2021 ........... G11C 11/223

OTHER PUBLICATIONS

Stefan Ferdinand Mueller, Development of HfO2-Based Ferroelectric Memories for Future CMOS Technology Nodes, 2016, Dresden University of Technology, Research at Namlab, Dresden, Germany.

(Continued)

*Primary Examiner* — Matthew E Warren
(74) *Attorney, Agent, or Firm* — William Park & Associates Ltd.

(57) ABSTRACT

A semiconductor device includes a stacked structure including conductive layers and insulating layers stacked alternately with each other, a channel layer passing through the stacked structure, a ferroelectric layer surrounding a sidewall of the channel layer, a first dielectric layer surrounding a sidewall of the ferroelectric layer, and sacrificial patterns interposed between the first dielectric layer and the insulating layers and including a material with a higher dielectric constant than the first dielectric layer.

11 Claims, 41 Drawing Sheets

(56) References Cited

U.S. PATENT DOCUMENTS

2017/0358362 A1* 12/2017 Lee ................... H01L 27/11529
2017/0373086 A1* 12/2017 Pang ................. H01L 21/02667
2018/0323200 A1* 11/2018 Tang ................. H01L 29/42376

OTHER PUBLICATIONS

Yougui Liao, Practical Electron Microscopy and Database (Online book), 2007, https://www.globalsino.com/EM/page1792.html, https://www.globalsino.com/EM/page1793.html, https://www.globalsino.com/EM/page1796.html.

* cited by examiner

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2020-0087832 filed on Jul. 15, 2020, in the Korean Intellectual Property Office, the entire disclosure of which is incorporated by reference herein.

BACKGROUND

1. Technical Field

Various embodiments of the invention relate generally to an electronic device, and more particularly, to a semiconductor device and a method of manufacturing the semiconductor device.

2. Related Art

Non-volatile memory devices retain stored data regardless of power on/off conditions. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes that are stacked alternately with each other, and channel layers passing therethrough, with memory cells stacked along the channel layers. Various structures and manufacturing methods have been developed to improve the operational reliability of three-dimensional non-volatile memory devices.

SUMMARY

According to an embodiment, a semiconductor device may include a stacked structure with conductive layers and insulating layers that are stacked alternately with each other, a channel layer passing through the stacked structure, a ferroelectric layer surrounding a sidewall of the channel layer, a first dielectric layer surrounding a sidewall of the ferroelectric layer, and sacrificial patterns interposed between the first dielectric layer and the insulating layers, the sacrificial patterns including a material with a higher dielectric constant than the first dielectric layer.

According to an embodiment, a method of manufacturing a semiconductor device may include forming a stacked structure with first material layers and second material layers that are stacked alternately with each other, forming a first opening passing through the stacked structure, the first opening with an inner wall that has the second material layers protruding farther than the first material layers, forming a sacrificial layer in the first opening, forming a first dielectric layer in the sacrificial layer, the first dielectric layer with a lower dielectric constant than the sacrificial layer, forming a ferroelectric layer in the first dielectric layer, and forming a channel layer in the ferroelectric layer.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments are directed to a semiconductor device with a stabilized structure and improved characteristics, and a manufacturing method thereof.

Figure 1A:
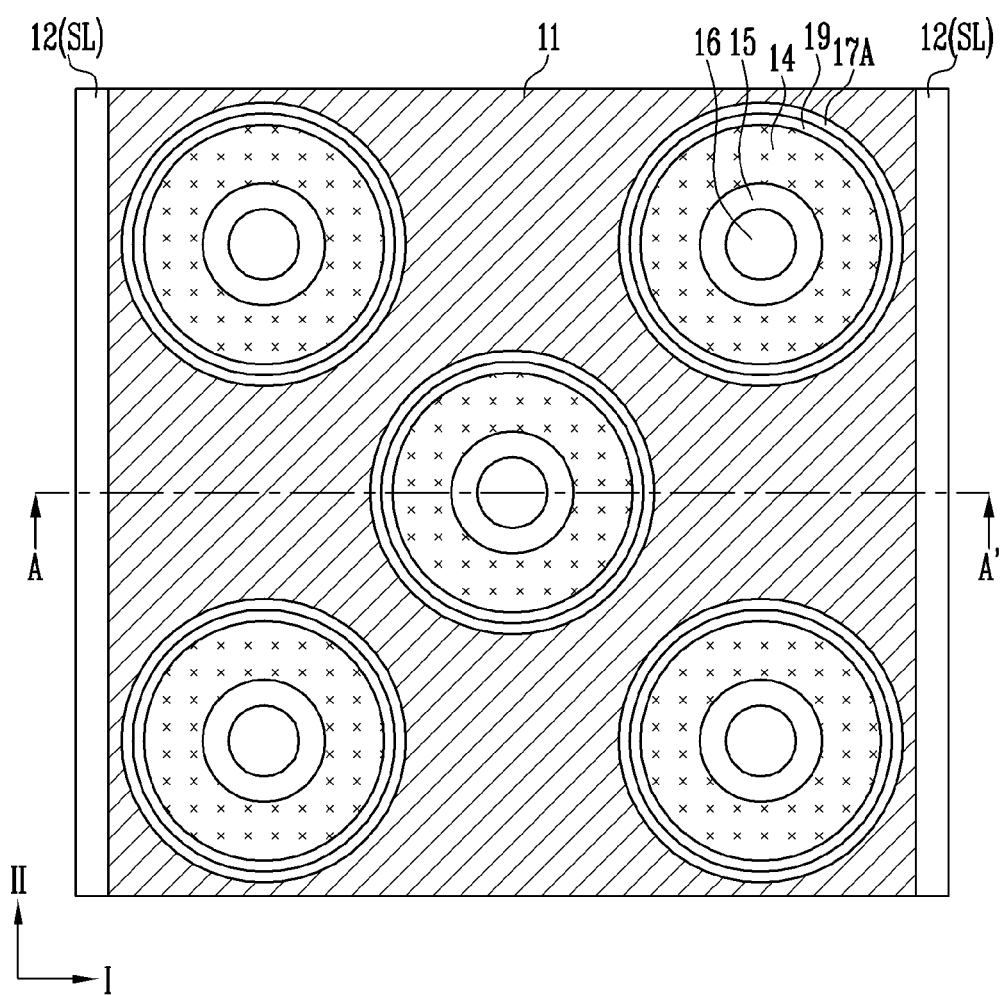
FIGS. 1A to 1C are diagrams, illustrating the structure of a semiconductor device, according to an embodiment of the present disclosure.
Figure 1B:
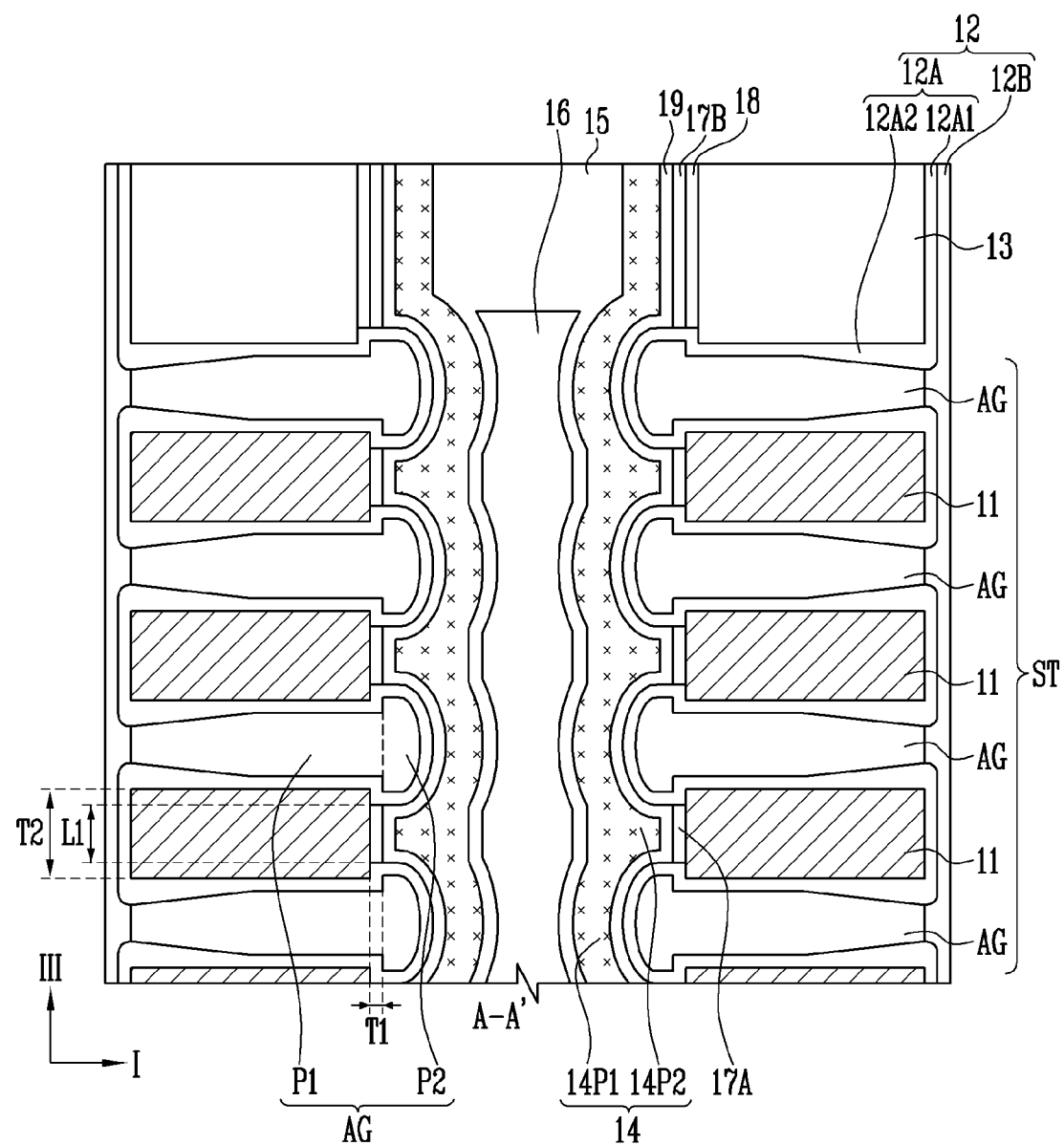
Figure 1C:
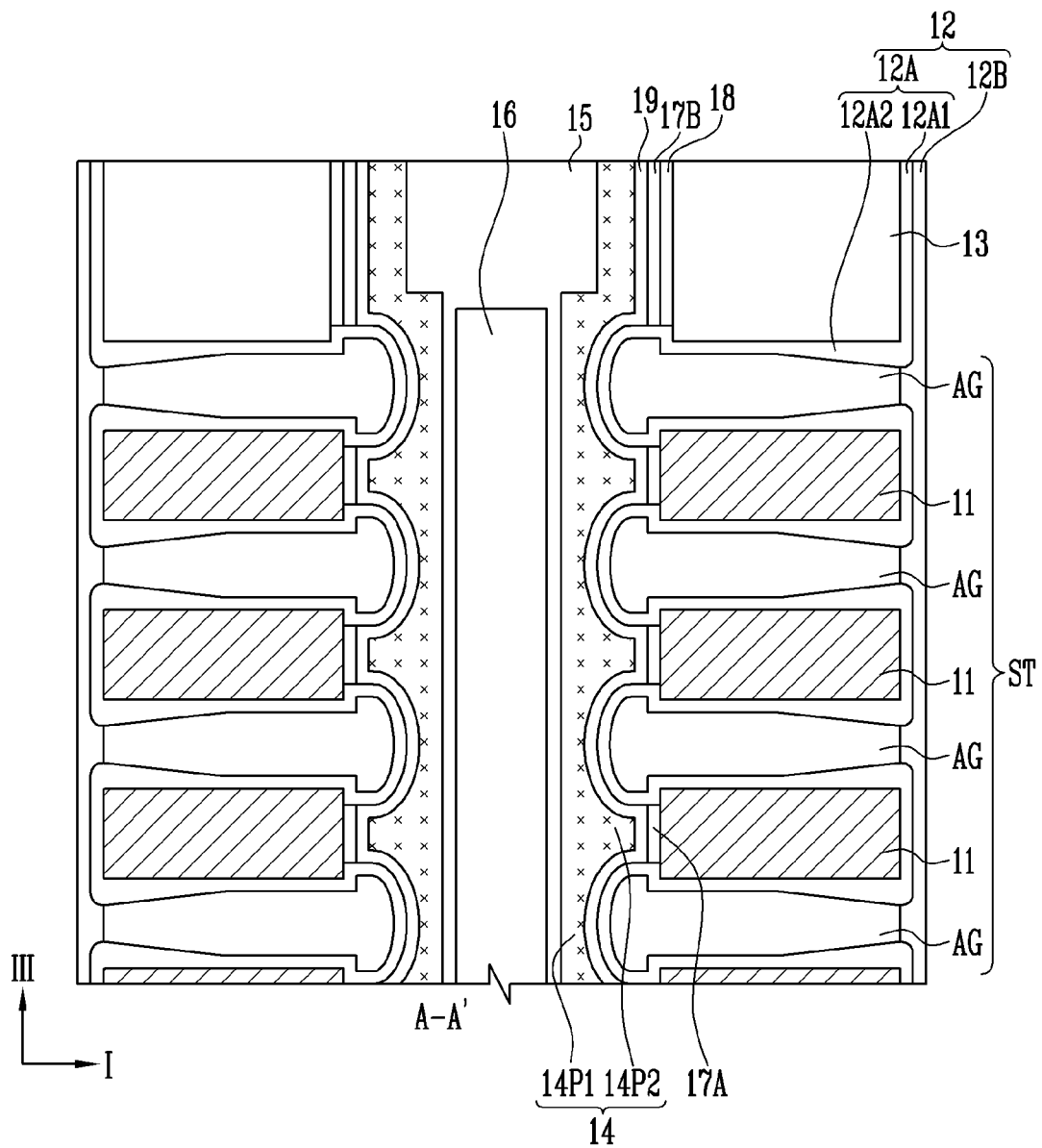

FIGS. 1A to 1C are diagrams, illustrating the structure of a semiconductor device, according to an embodiment of the present disclosure. FIGS. 1B and 1C show A-A' cross-sections of FIG. 1A.

Referring to FIGS. 1A to 1C, the semiconductor device may include conductive layers 11, a channel layer 15, a ferroelectric layer 14, first dielectric patterns 17A, and air gaps AG. The semiconductor device may further include a sealing layer 12, a mask pattern 13, a gap-filling layer 16, a first dielectric pattern 17B, a sacrificial pattern 18, a second dielectric layer 19, or a combination thereof.

The semiconductor device may include a stacked structure ST and the stacked conductive layers 11. According to an embodiment, the stacked structure ST may include the conductive layers 11 and the air gaps AG that are stacked alternately with each other. The mask pattern 13 may be located above the stacked structure ST. The mask pattern 13 may include nitride, a carbon-based material, or a combination thereof.

The conductive layers 11 may be gate electrodes of select transistors, memory cells, and the like. The conductive layers 11 may include metal, such as tungsten or molybdenum, or a conductive material, such as polysilicon or silicide. The air gaps AG may be a hollow space that is not filled with material layers, and may be filled with air.

Each of the air gaps AG may include a first portion P1 interposed between the conductive layers 11 and a second portion P2 protruding further toward the channel layer 15 than the conductive layers 11. In a third direction III, the second portion P2 may have a greater width than the first portion P1. The conductive layers 11 and the air gaps AG may be stacked in the third direction III.

A slit SL may pass through the stacked structure ST in the third direction III. The sealing layer 12 may be formed to fill a portion of the slit SL. The sealing layer 12 may include an insulating material, such as oxide.

The sealing layer 12 may include either or both of a first sealing layer 12A and a second sealing layer 12B. The first sealing layer 12A may include a first portion 12A1 formed in the slit SL and a second portion 12A2 extending into the stacked conductive layers 11. The second portion 12A2 may extend between first dielectric patterns 17A and 17B and contact the ferroelectric layer 14. The air gaps AG may be located in the second portions 12A2, respectively.

The second portion 12A2 may include a flat inner surface, an inclined inner surface, or a combination thereof. For example, when the second portion 12A2 includes the inclined inner surface, the thickness of the inner surface of the second portion 12A2 that is close to the slit SL may be greater than the thickness of the inner surface that is close to the channel layer 15. The second sealing layer 12B may be formed in the slit SL. The region of the air gap AG may be defined by either or both of the first sealing layer 12A and the second sealing layer 12B.

The channel layer 15 may pass through the stacked structure ST in the third direction III. The plurality of channel layers 15 may be arranged in a first direction I and in a second direction II, the second direction intersecting the first direction I. The second direction II may be orthogonal to the first direction I. The third direction III may intersect the first direction I and the second direction II. According to an embodiment, the third direction III may protrude from the plane that is defined by the first direction I and the second direction II. The channel layer 15 may include a semiconductor material, such as silicon, germanium, or polysilicon, or may include a nanostructure.

The channel layer 15 may have a tubular structure with an opened central area, a structure with a solid central area, or a combination thereof. The channel layer 15 may have an irregular inner surface, an irregular outer surface, or irregular inner and external surfaces. When the inner surface or the outer surface of the channel layer 15 has an irregular structure, the channel layer 15 may have a relatively great width at levels that correspond to the conductive layers 11 and a relatively small width at levels that correspond to the air gaps AG.

The gap-filling layer 16 may be formed in the channel layer 15 and the gap-filling layer 16 may include an insulating material, such as oxide or nitride.

The ferroelectric layer 14 may be formed to surround a sidewall of the channel layer 15. The ferroelectric layer 14 may be interposed between the channel layer 15 and the conductive layers 11 and between the channel layer 15 and the air gaps AG. In addition, the ferroelectric layer 14 may be interposed between the channel layer 15 and the mask pattern 13.

The ferroelectric layer 14 may surround the second portions P2 of the air gaps AG. The ferroelectric layer 14 may include a first portion 14P1 that surrounds the sidewall of the channel layer 15 and second portions 14P2 that protrude from the first portion 14P1. The second portions 14P2 of the ferroelectric layer 14 may extend between the second portions P2 of the air gaps AG.

A sidewall of the ferroelectric layer 14 may include grooves that are defined between the second portions 14P2. The grooves may be located at levels that correspond to the air gaps AG. Either or both of the air gaps AG and the first sealing layer 12A may be located in the grooves, respectively.

The ferroelectric layer 14 may include an irregular or flat inner surface. Referring to FIG. 1B, the inner surface of the ferroelectric layer 14 may be curved along the profile of the second portions P2 of the air gaps AG. Referring to FIG. 1C, the ferroelectric layer 14 may have a flat inner surface. The inner surface of the ferroelectric layer 14 may be an etched surface. The channel layer 15 may accordingly have flat outer and inner surfaces.

The first dielectric patterns 17A may be interposed between the ferroelectric layer 14 and the conductive layers 11. The first dielectric patterns 17B may be interposed between the ferroelectric layer 14 and the mask pattern 13. The first dielectric patterns 17A and 17B may include a material with a larger band gap than the ferroelectric layer 14. The first dielectric patterns 17A and 17B may include oxide. According to an embodiment, the first dielectric patterns 17A and 17B may include silicon oxide ($SiO_2$).

Each of the first dielectric patterns 17A may include a first thickness T1 in the first direction I and a first length L1 in the third direction III. The conductive layers 11 may have a second thickness T2 in the third direction III. The first length L1 may have a value that is substantially the same as or smaller than the second thickness T2.

However, when the first thickness T1 is too small, it may be difficult to prevent a gate breakdown of a memory cell. On the other hand, when the first thickness T1 is too large, ferroelectric characteristics may be deteriorated due to a depolarization field. Therefore, the first thickness T1 may be determined in consideration of the gate breakdown of the memory cell and the deterioration of ferroelectric characteristics that is caused by the depolarization field. The first thickness T1 may range from 10 Å to 30 Å.

The sacrificial pattern 18 may be interposed between the first dielectric pattern 17B and the mask pattern 13. The sacrificial pattern 18 may be a residue of the protective layer that is used during manufacturing processes. The sacrificial pattern 18 may include a material with a high etch selectivity with respect to oxide or nitride. The sacrificial pattern 18 may include a material with a higher dielectric constant than the first dielectric patterns 17A and 17B. The sacrificial pattern 18 may include a high-k material and may include titanium (Ti), zirconium (Zr), or hafnium (Hf). According to an embodiment, the sacrificial pattern 18 may include a high-k material that is doped with silicon (Si).

The second dielectric layer 19 may surround the ferroelectric layer 14. The second dielectric layer 19 may be interposed between the ferroelectric layer 14 and the first dielectric patterns 17A and between the ferroelectric layer 14 and the air gaps AG. The second dielectric layer 19 may be interposed between the ferroelectric layer 14 and the first sealing layer 12A. The second dielectric layer 19 may improve the adhesion of the ferroelectric layer 14 with respect to the first sealing layer 12A and the first dielectric patterns 17A and 17B.

The second dielectric layer 19 may include a material with a higher dielectric constant than the first dielectric patterns 17A and 17B. According to an embodiment, the second dielectric layer 19 may include a high-k material and may include $SiO_2$, $HfO_2$, $ZrO_2$, $La_2O_3$, $TiO_2$, or the like. Alternatively, the second dielectric layer 19 may include a material with a larger band gap than the ferroelectric layer 14. According to an embodiment, the second dielectric layer 19 may include $SiO_2$.

According to the above-described structure, transistors may be located at intersections between the channel layer 15 and the conductive layers 11. The transistors may be memory cells or select transistors. Each memory cell may include the ferroelectric layer 14 and may store data based on the polarized state of the ferroelectric layer 14.

The air gaps AG may exist between the stacked memory cells. The air gaps AG may protrude farther toward the channel layer 15 than the conductive layers 11. Therefore, a fringe field in a space area between the memory cells may be effectively controlled. The interference between the memory cells as well as a parasitic capacitor between the stacked memory cells may be reduced.

Each of the memory cells may include the first dielectric pattern 17A and the second dielectric layer 19. When the first dielectric pattern 17A includes a material with a larger band gap than the ferroelectric layer 14, a gate breakdown voltage of the memory cell may be ensured. In the same manner, when the second dielectric layer 19 includes a material with a larger bandgap than the ferroelectric layer 14, the breakdown voltage of the memory cell may be ensured.

When the second dielectric layer 19 includes a high-k material, strength of electric field applied to the second dielectric layer 19 may be reduced, and strength of electric field applied to the ferroelectric layer 14 may be increased. Therefore, the voltage level of an operating voltage that is used during a program, read, or erase operation may be reduced, and the memory window may be improved.

Figure 2A:
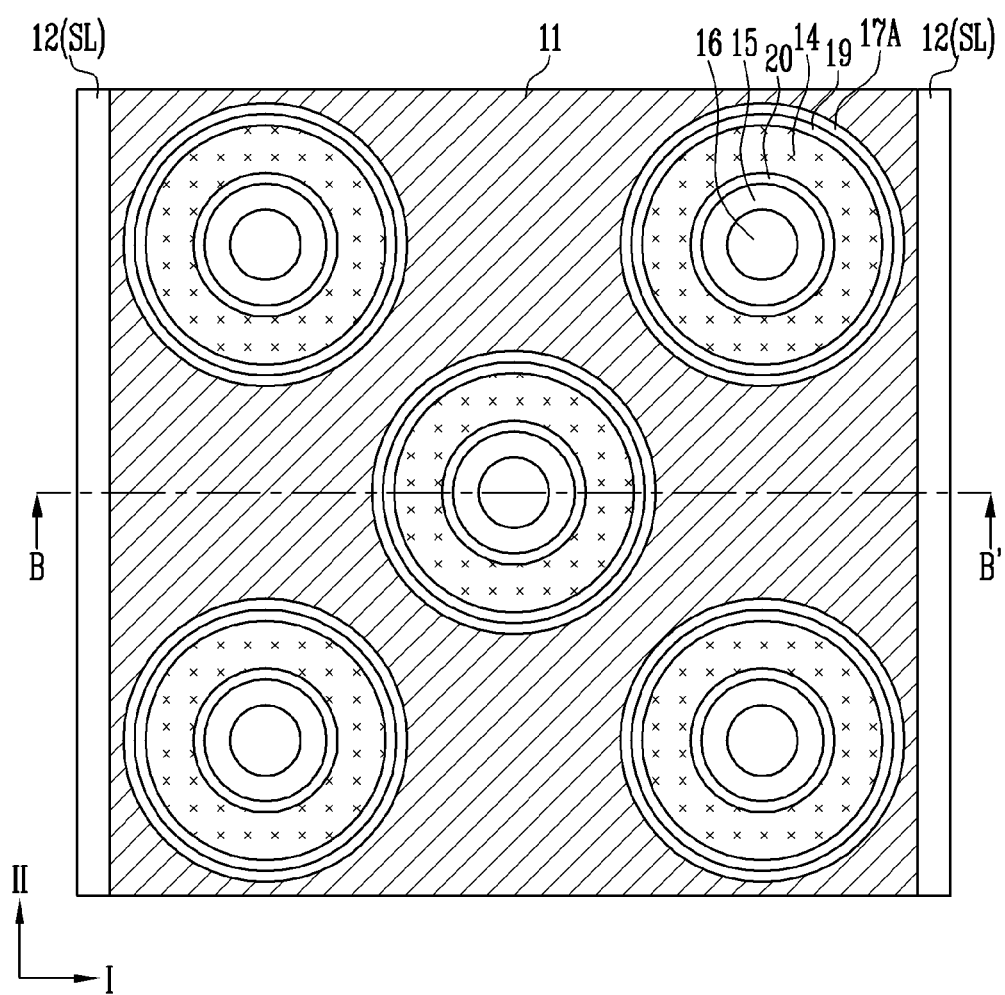
FIGS. 2A to 2C are diagrams, illustrating the structure of a semiconductor device, according to an embodiment of the present disclosure.
Figure 2B:
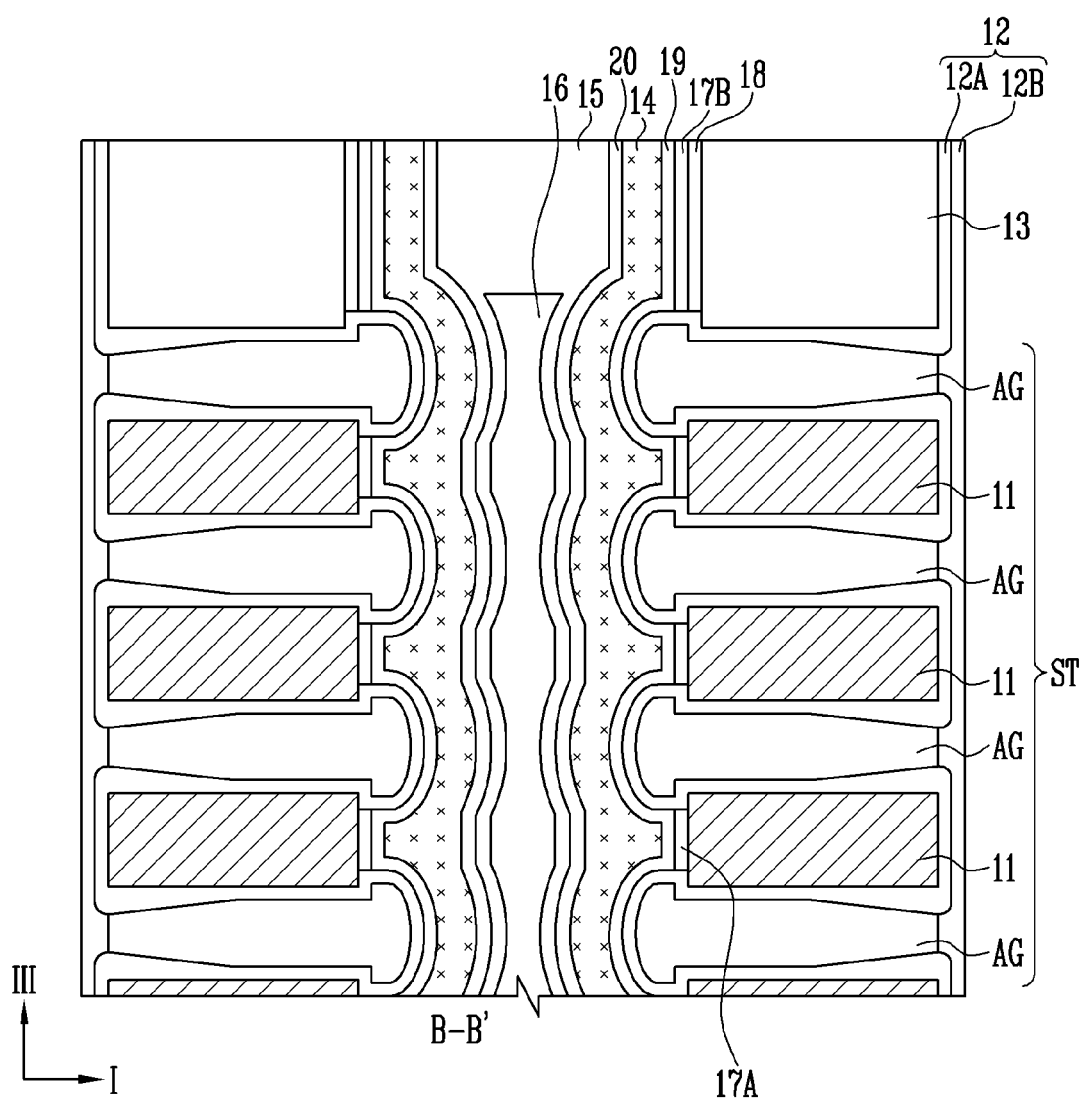
Figure 2C:
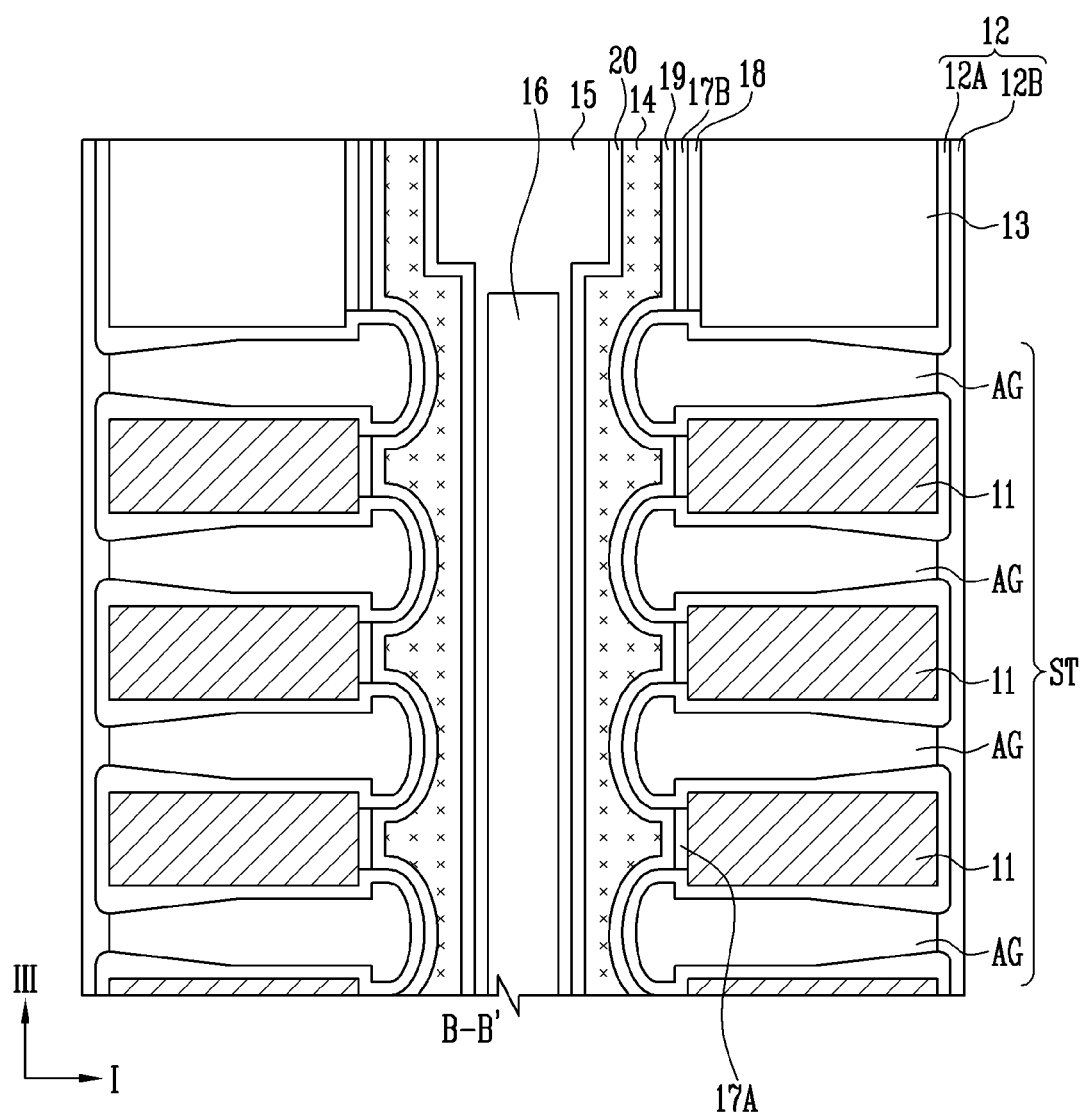

FIGS. 2A to 2C are diagrams, illustrating the structure of a semiconductor device, according to an embodiment of the present disclosure. FIGS. 2B and 2C show B-B' cross-sections of FIG. 2A. Hereinafter, any repetitive detailed description of components that have already been mentioned above will be omitted.

Referring to FIGS. 2A to 2C, the semiconductor device may include the conductive layers 11, the channel layer 15, the ferroelectric layer 14, the first dielectric patterns 17A, and the air gaps AG. The semiconductor device may further include the sealing layer 12, the mask pattern 13, the gap-filling layer 16, the first dielectric pattern 17B, the sacrificial pattern 18, the second dielectric layer 19, a third dielectric layer 20, or a combination thereof.

The third dielectric layer 20 may surround a sidewall of the channel layer 15. The third dielectric layer 20 may be interposed between the channel layer 15 and the ferroelectric layer 14. The adhesion between the ferroelectric layer 14 and the channel layer 15 may be improved by the third dielectric layer 20.

The third dielectric layer 20 may be formed along the inner surface of the ferroelectric layer 14. Referring to FIG. 2B, the inner surface of the ferroelectric layer 14 may have a profile in which the grooves of an outer surface thereof are transferred to the inner surface. The inner surface of the ferroelectric layer 14 may be curved, and the third dielectric layer 20 may be conformally formed along the curved inner surface of the ferroelectric layer 14. Referring to FIG. 2C, the ferroelectric layer 14 may have a flat inner surface. The inner surface of the ferroelectric layer 14 may be an etched surface and the third dielectric layer 20 may be conformally formed along the flat inner surface. Accordingly, the third dielectric layer 20 or the channel layer 15 may have a flat outer surface and a flat inner surface.

The third dielectric layer 20 may include substantially the same or different material compared to the second dielectric layer 19. The third dielectric layer 20 may include a material with a higher dielectric constant than the first dielectric patterns 17A. According to an embodiment, the third dielectric layer 20 may include a high-k material and may include $SiO_2$, $HfO_2$, $ZrO_2$, $La_2O_3$, $TiO_2$, or the like. Alternatively, the third dielectric layer 20 may include a material with a larger band gap than the ferroelectric layer 14. According to an embodiment, the third dielectric layer 20 may include $SiO_2$.

According to the above-described structure, the memory cell may include the first dielectric pattern 17A and the second dielectric layer 19, or the first dielectric pattern 17A and the third dielectric layer 20, or the first dielectric pattern 17A, the second dielectric layer 19, and the third dielectric layer 20.

Figure 3A:
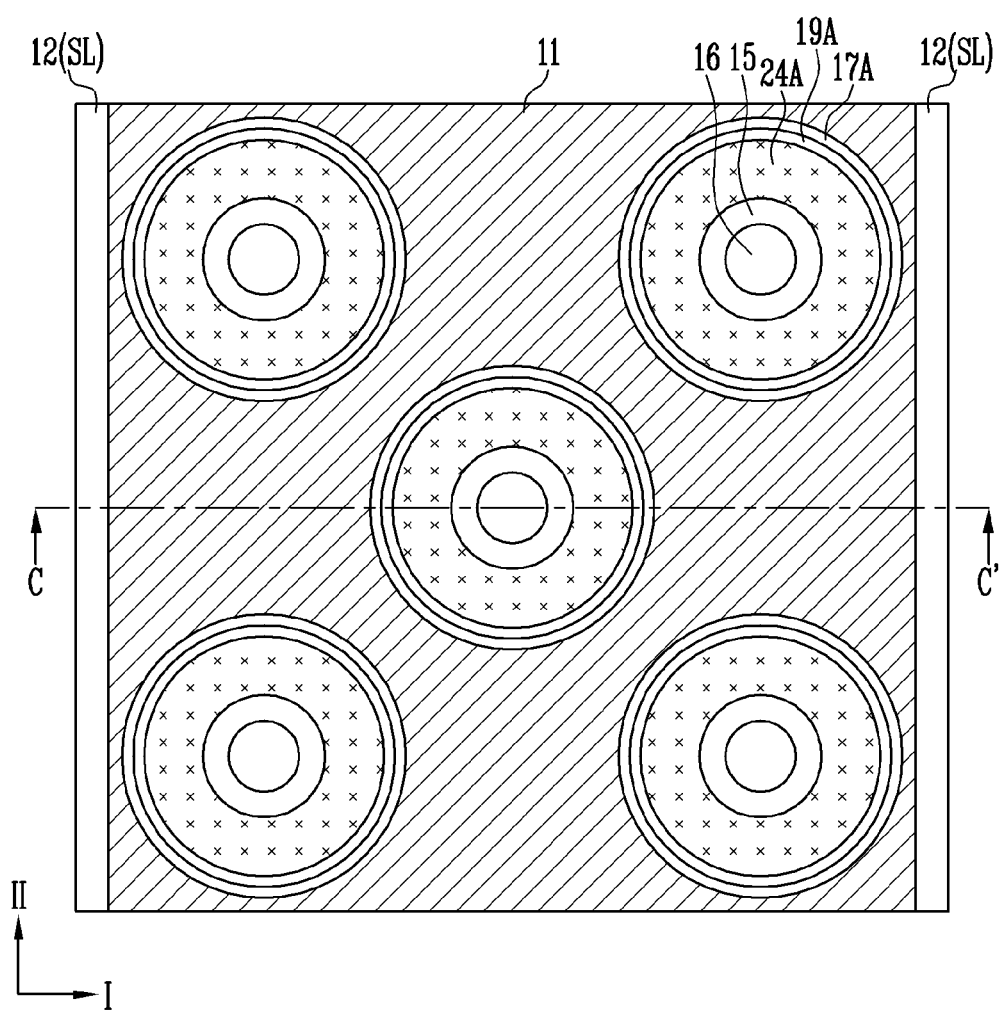
FIGS. 3A and 3B are views, illustrating the structure of a semiconductor device, according to an embodiment of the present disclosure.
Figure 3B:
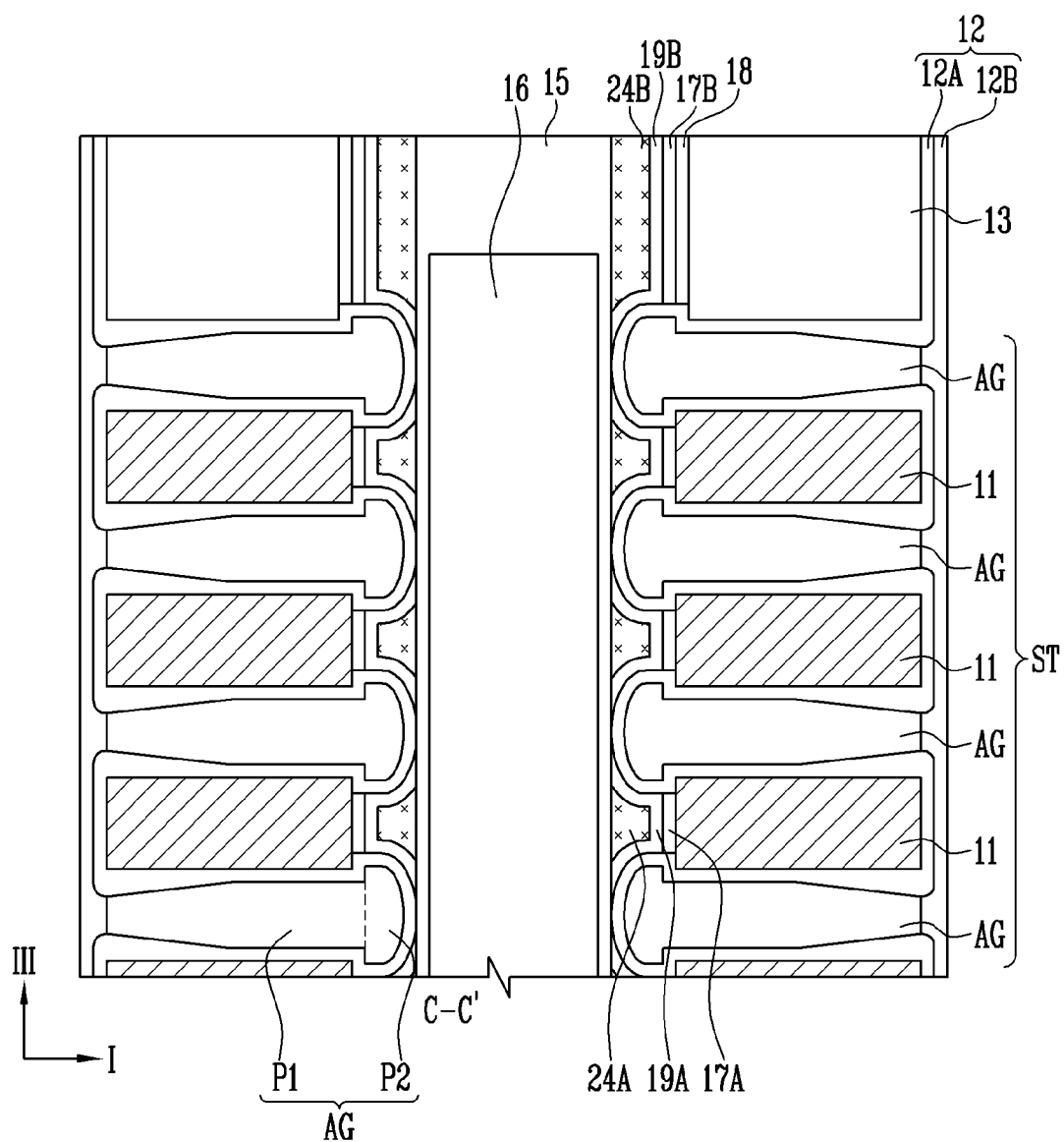

FIGS. 3A and 3B are diagrams, illustrating the structure of a semiconductor device, according to an embodiment of the present disclosure. FIG. 3B shows a C-C' cross-section. Hereinafter, any repetitive detailed description of components that have already been mentioned above will be omitted.

Referring to FIGS. 3A and 3B, the semiconductor device may include the conductive layers 11, the channel layer 15, ferroelectric patterns 24A, the first dielectric patterns 17A, and the air gaps AG. The semiconductor device may further include the sealing layer 12, the mask pattern 13, the gap-filling layer 16, the first dielectric pattern 17B, the sacrificial pattern 18, second dielectric patterns 19A, second dielectric patterns 19B, ferroelectric patterns 24B, or a combination thereof.

The ferroelectric patterns 24A may be formed to surround the sidewall of the channel layer 15. The ferroelectric patterns 24A may be located at levels that correspond to the conductive layers 11 and may be separated from each other. The ferroelectric pattern 24B may be interposed between the channel layer 15 and the mask pattern 13.

The first dielectric patterns 17A may be interposed between the ferroelectric patterns 24A and the conductive layers 11. The first dielectric patterns 17B may be interposed between the ferroelectric pattern 24B and the mask pattern 13.

The second dielectric patterns 19A may be interposed between the ferroelectric patterns 24A and the first dielectric patterns 17A. In addition, the second dielectric patterns 19A may extend between the ferroelectric patterns 24A and the first sealing layer 12A. The second dielectric patterns 19A may have a C-shaped cross-section so that each of the second dielectric patterns 19A may surround each of the ferroelectric patterns 24B. The second dielectric patterns 19A may be interposed only between the ferroelectric patterns 24A and the first dielectric patterns 17A. The second dielectric patterns 19A may have an I-shaped cross-section. The second dielectric patterns 19B may be interposed between the ferroelectric pattern 24B and the first dielectric pattern 17B.

The air gaps AG may be interposed between the conductive layers 11 and may extend between the ferroelectric patterns 24A. The ferroelectric patterns 24A may be located between the second portions P2 the air gaps AG.

According to the above-described structure, the memory cells may include the ferroelectric patterns 24A, respectively. When the stacked memory cells share a ferroelectric layer, the interference in the third direction III between the stacked memory cells may occur. For example, when the second memory cell is programmed after the first memory cell is programmed, an electric field that is more than the Coercive Field (Ec) may be applied to the ferroelectric layer in a space area by the fringe field that is caused by the program operation of the first memory cell. In addition, when the second memory cell is programmed to a polarized state that is different from that of the first memory cell, the electric field that is more than the Coercive Field (Ec) may be applied to the ferroelectric layer of the space area or the first memory cell by the fringe field that is caused by the program operation of the second memory cell. As a result, the threshold voltage of the first memory cell may be changed and a program-erase window may be reduced. Such an interference phenomenon may be worsened as the distance between the stacked memory cells decreases. In addition, the fringe field may make it difficult to the control the ferroelectric layer in the space area. Therefore, according to an embodiment, the ferroelectric patterns 24A may be formed by removing the ferroelectric layer in the space area. Since the memory cells include the ferroelectric patterns 24A, respectively, the interference may be reduced or prevented, and reliability may be improved.

Figure 4A:
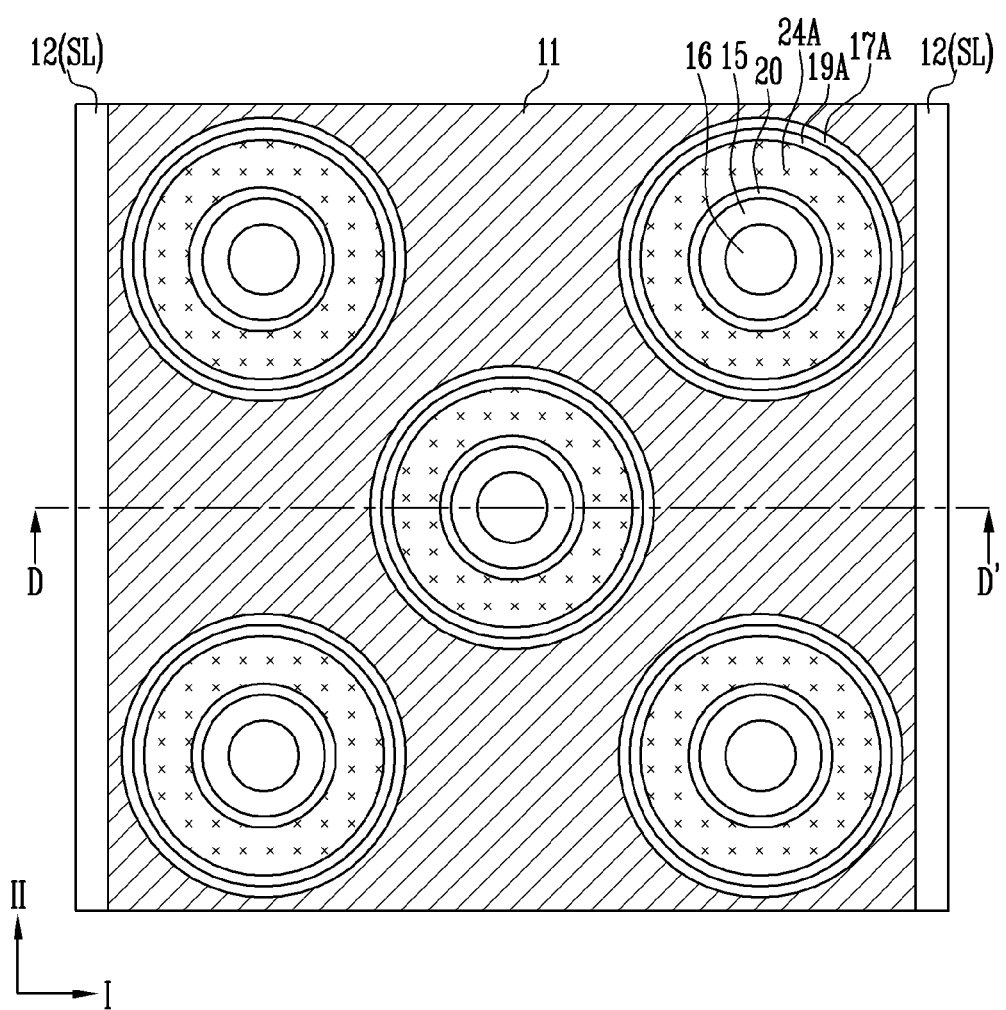
FIGS. 4A and 4B are views, illustrating the structure of a semiconductor device, according to an embodiment of the present disclosure.
Figure 4B:
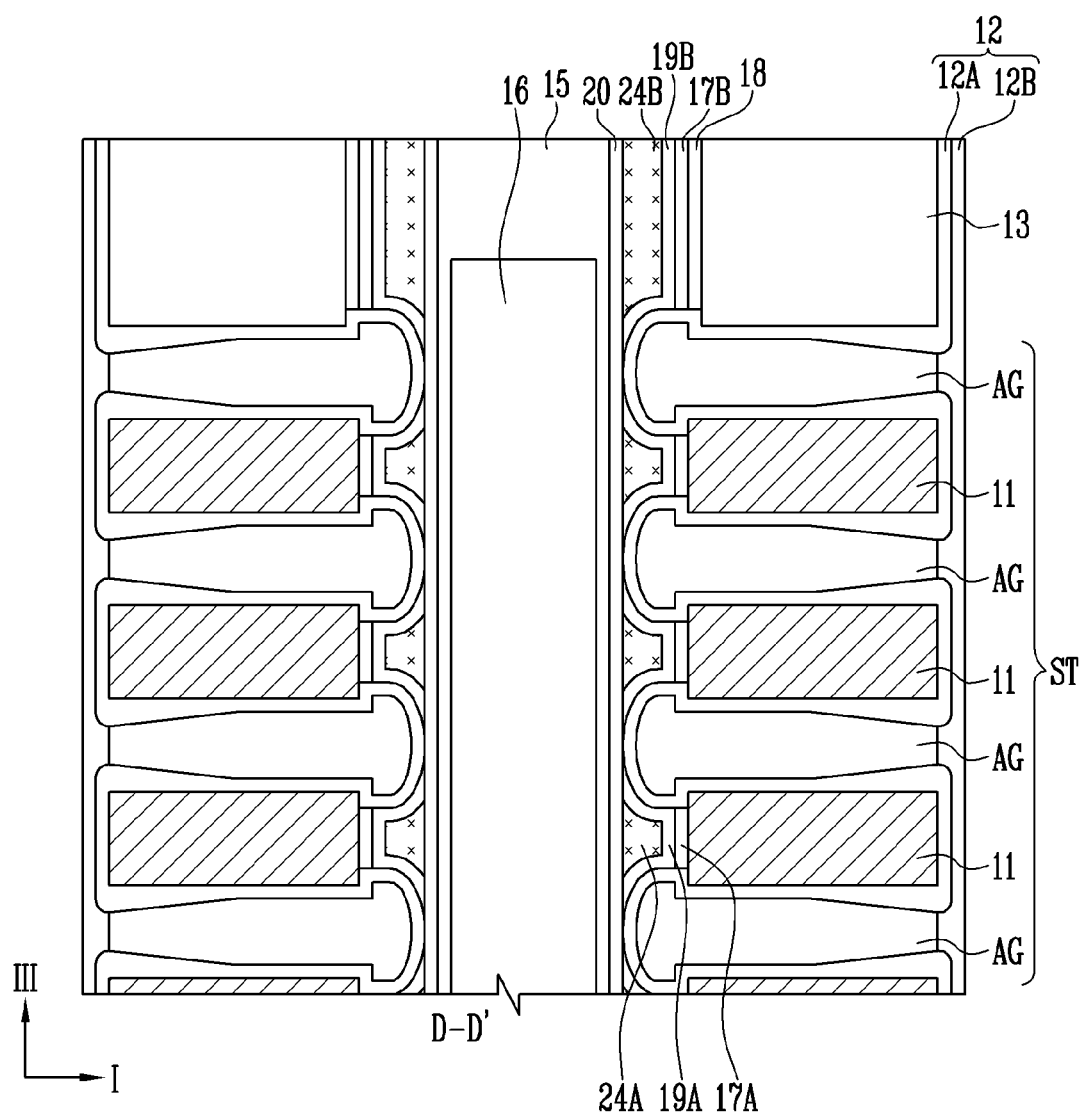

FIGS. 4A and 4B are views, illustrating the structure of a semiconductor device, according to an embodiment of the present disclosure. FIG. 4B shows a D-D' cross-section of FIG. 4A. Hereinafter, any repetitive detailed description of components that have already been mentioned above will be omitted.

Referring to FIGS. 4A and 4B, the semiconductor device may include the conductive layers 11, the channel layer 15, the ferroelectric patterns 24A, the first dielectric patterns 17A, and the air gaps AG. The semiconductor device may further include the sealing layer 12, the mask pattern 13, the gap-filling layer 16, the first dielectric pattern 17B, the sacrificial pattern 18, the second dielectric patterns 19A, the second dielectric patterns 19B, the ferroelectric patterns 24B, the third dielectric layer 20, or a combination thereof.

The third dielectric layer 20 may surround a sidewall of the channel layer 15. The third dielectric layer 20 may be interposed between the channel layer 15 and the ferroelectric patterns 24A and 24B. The third dielectric layer 20 may be interposed between the channel layer 15 and the air gaps AG and between the channel layer 15 and the first sealing layer 12A. The adhesion between the ferroelectric patterns 24A and 24B and the channel layer 15 may be improved by the third dielectric layer 20. The third dielectric layer 20 may be conformally formed along inner surfaces of the ferroelectric patterns 24A and 24B.

According to the above-described structure, the memory cell may include the first dielectric pattern 17A and the second dielectric pattern 19A, or the first dielectric pattern 17A and the third dielectric layer 20, or the first dielectric pattern 17A, the second dielectric pattern 19A, and the third dielectric layer 20.

Figure 5A:
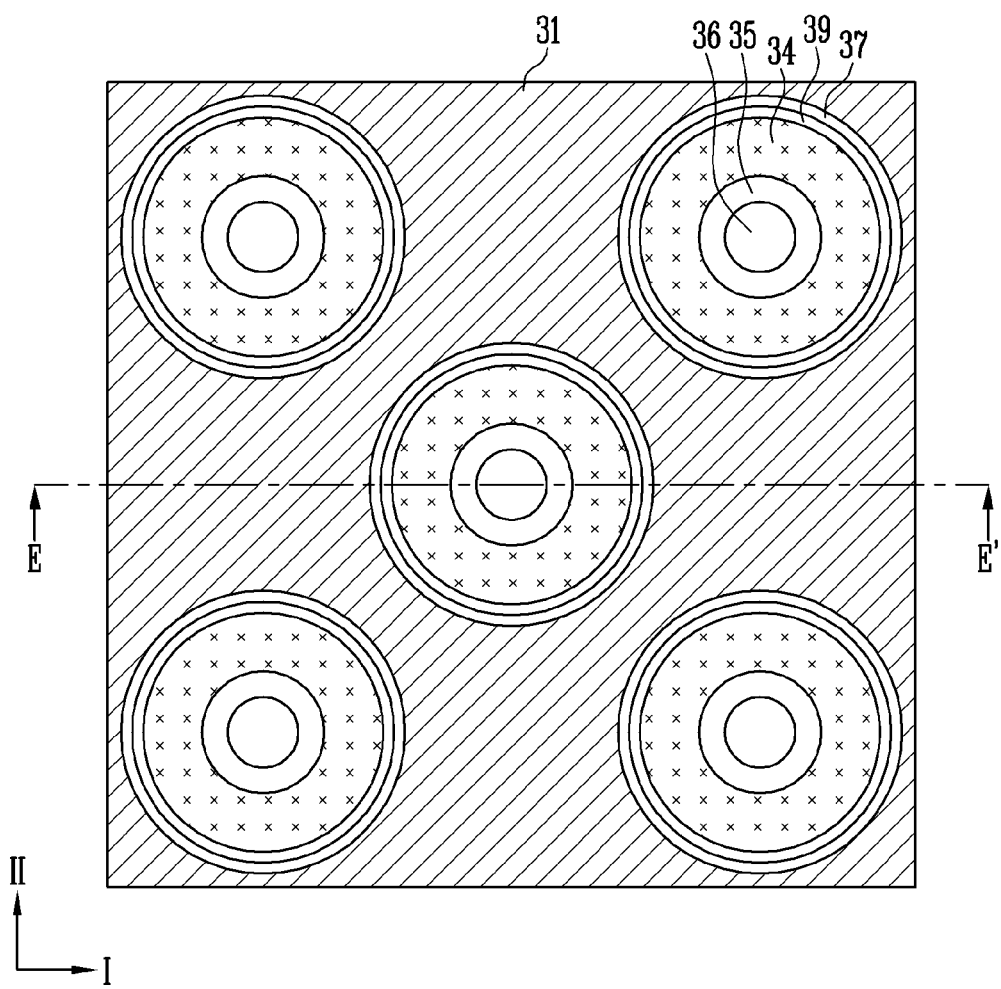
FIGS. 5A to 5C are diagrams, illustrating the structure of a semiconductor device, according to an embodiment of the present disclosure.
Figure 5B:
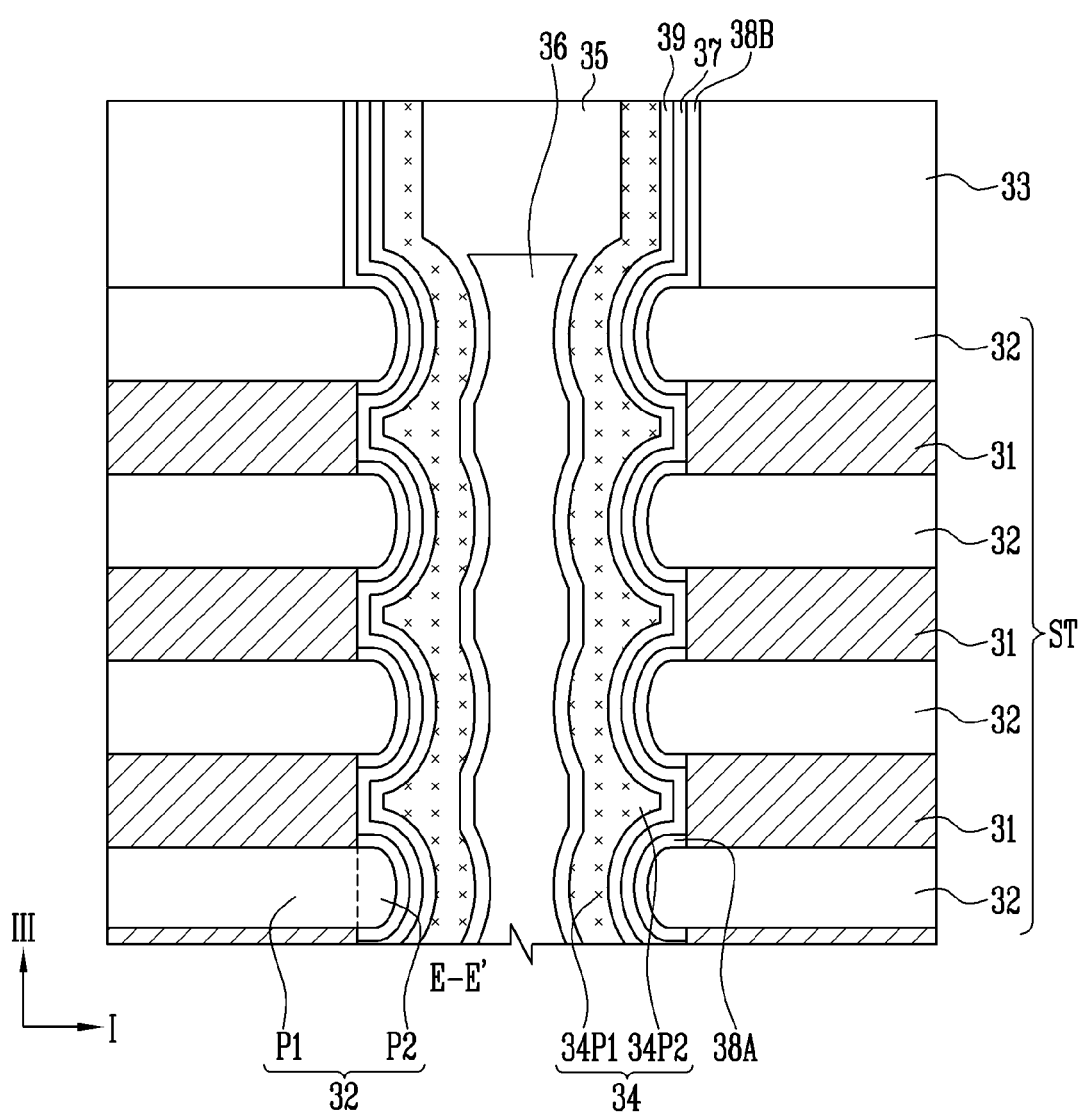
Figure 5C:
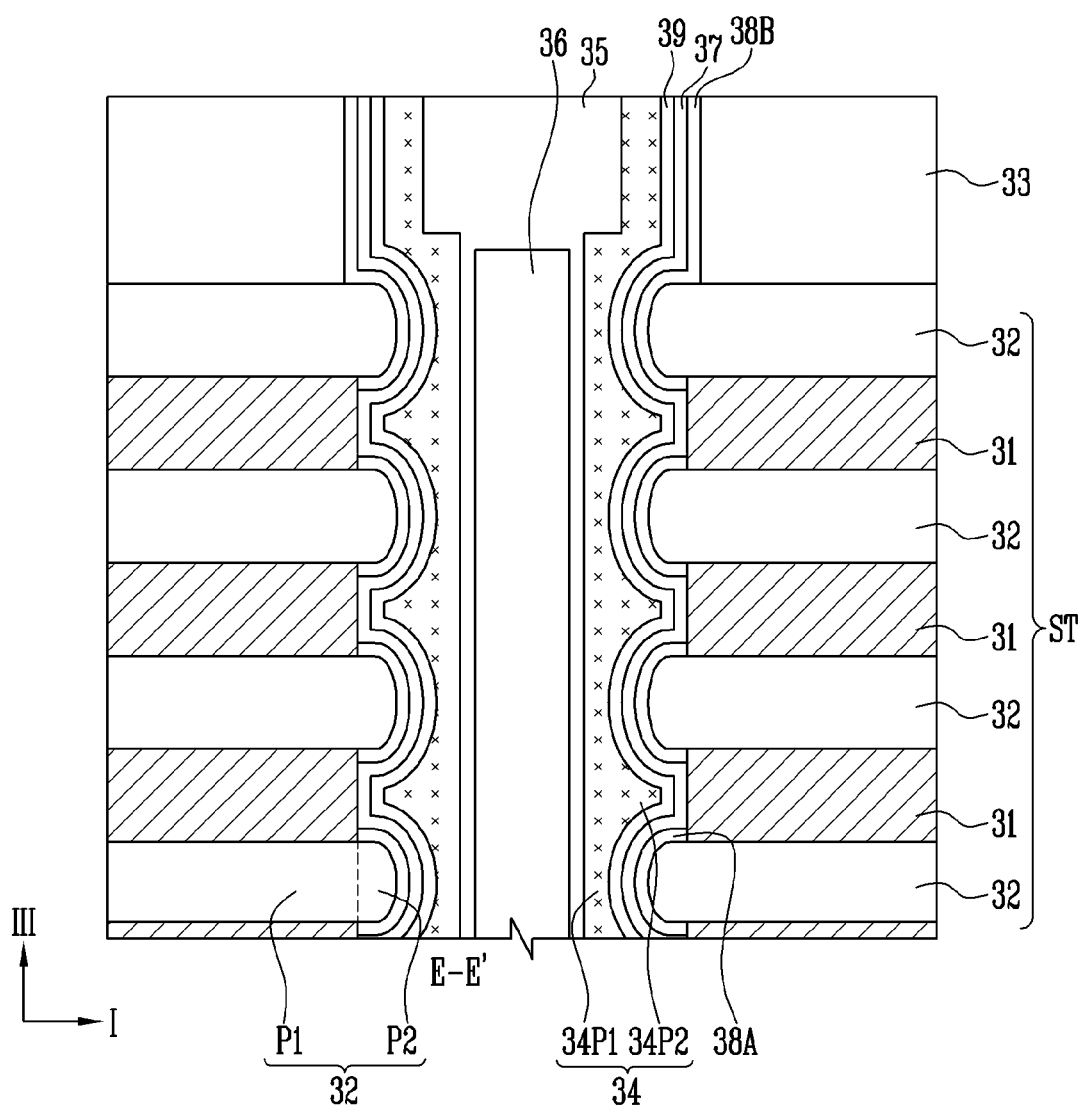

FIGS. 5A to 5C are diagrams, illustrating the structure of a semiconductor device, according to an embodiment of the present disclosure. FIGS. 5B and 5C show E-E' cross-sections of FIG. 5A. Hereinafter, any repetitive detailed description of components that have already been mentioned above will be omitted.

Referring to FIGS. 5A to 5C, the semiconductor device may include the stacked structure ST, a channel layer 35, a ferroelectric layer 34, a first dielectric layer 37 and sacrificial patterns 38A. The semiconductor device may further include a gap-filling layer 36, a sacrificial pattern 38B, a second dielectric layer 39, or a combination thereof.

The stacked structure ST may include conductive layers 31 and insulating layers 32 that are stacked alternately with each other. A mask pattern 33 may be located over the stacked structure ST. The mask pattern 33 may include nitride, a carbon-based material, or a combination thereof.

The conductive layers 31 may be gate electrodes of select transistors, memory cells, and the like. The conductive layers 31 may include metal, such as tungsten or molybdenum, or a conductive material, such as polysilicon or silicide. The insulating layers 32 may insulate the gate electrodes from each other and may include an insulating material, such as oxide or nitride.

Each of the insulating layers 32 may include the first portion P1 that is interposed between the conductive layers 31 and the second portion P2 protruding further toward the channel layer 35 than the conductive layers 31. The second portion P2 may include a rounded edge. In the third direction III, the width of the second portion P2 may be substantially the same as, greater than, or smaller than that of the first portion P1.

The channel layer 35 may pass through the stacked structure ST in the third direction III. The plurality of channel layers 35 may be arranged in the first direction I and the second direction II. The channel layer 35 may include a semiconductor material, such as silicon, germanium, or polysilicon, or may include a nanostructure.

The channel layer 35 may have a tubular structure with an opened central area, a structure with a solid central area, or a combination thereof. The channel layer 35 may have an irregular inner surface, an irregular outer surface, or irregular inner and external surfaces. When the inner or outer surface of the channel layer 35 has irregularities, the channel layer 35 may have a relatively great width at levels that correspond to the conductive layers 31 and a relatively small width at levels that correspond to the insulating layers 32.

The gap-filling layer 36 may be formed in the channel layer 35 and may include an insulating material, such as oxide or nitride.

The ferroelectric layer 34 may be formed to surround a sidewall of the channel layer 35. The ferroelectric layer 34 may be interposed between the channel layer 35 and the conductive layers 31 and between the channel layer 35 and the insulating layers 32. In addition, the ferroelectric layer 34 may be interposed between the channel layer 35 and the mask pattern 33.

The ferroelectric layer 34 may surround the second portions P2 of the insulating layers 32. The ferroelectric layer 34 may include a first portion 34P1 that surrounds the sidewall of the channel layer 35 and a second portion 34P2 that protrudes from the first portion 34P1. The second portions 34P2 of the ferroelectric layer 34 may extend between the second portions P2 of the insulating layers 32.

The sidewall of the ferroelectric layer 34 may include grooves that are defined between the second portions 34P2. The grooves may be located at levels that correspond to the insulating layers 32. Each of the insulating layers 32 may be located in each of the grooves. In addition, the sacrificial patterns 38A and 38B, the first dielectric layer 37, the second dielectric layer 39, or a combination thereof may be further formed in each of the grooves.

The ferroelectric layer 34 may include an irregular or flat inner surface. Referring to FIG. 5B, the inner surface of the ferroelectric layer 34 may be curved along the profile of the second portions P2 of the insulating layers 32. Referring to FIG. 5C, the ferroelectric layer 34 may have a flat inner surface. The inner surface of the ferroelectric layer 34 may be an etched surface. The channel layer 35 may accordingly have a flat outer or inner surface.

The first dielectric layer 37 may surround the sidewall of the ferroelectric layer 34. The first dielectric layer 37 may be interposed between the ferroelectric layer 34 and the conductive layers 31 and between the ferroelectric layer 34 and the insulating layers 32. In addition, the first dielectric layer 37 may be interposed between the ferroelectric layer 34 and the mask pattern 33.

The first dielectric layer 37 may include a material with a larger band gap than the ferroelectric layer 34. The first dielectric layer 37 may include oxide. According to an embodiment, the first dielectric layer 37 may include $SiO_2$.

The sacrificial patterns 38A may be interposed between the ferroelectric layer 34 and the insulating layers 32. Each of the sacrificial patterns 38A may surround each of the second portions P2 of the insulating layers 32. The sacrificial patterns 38B may be interposed between the first dielectric layer 37 and the mask pattern 33. The sacrificial patterns 38A and 38B may be separated from each other by the conductive layers 31.

The sacrificial patterns 38A and 38B may include a material with a high etch selectivity with respect to oxide or nitride. The sacrificial patterns 38A and 38B may include a material with a higher dielectric constant than the first dielectric layer 37. The sacrificial patterns 38A and 38B may include a high-k material and may include titanium (Ti), zirconium (Zr), or hafnium (Hf). According to an embodiment, the sacrificial patterns 38A and 38B may include a high-k material that is doped with silicon (Si). The sacrificial patterns 38A and 38B may have a thickness that ranges from 5 Å to 20 Å.

The second dielectric layer 39 may surround the ferroelectric layer 34. The second dielectric layer 39 may be interposed between the ferroelectric layer 34 and the first dielectric layer 37. The adhesion between the ferroelectric layer 34 and the first dielectric layer 37 may be improved by the second dielectric layer 39.

The second dielectric layer 39 may include a material with a higher dielectric constant than the first dielectric layer 37. According to an embodiment, the second dielectric layer 39 may include a high-k material and may include $SiO_2$, $HfO_2$, $ZrO_2$, $La_2O_3$, $TiO_2$, or the like. Alternatively, the second dielectric layer 39 may include a material with a larger band gap than the ferroelectric layer 34. According to an embodiment, the second dielectric layer 39 may include $SiO_2$.

According to the above-described structure, the insulating layers 32 may be located between the stacked memory cells, and the insulating layers 32 may protrude farther toward the channel layer 35 than the conductive layers 31. The insulating layers 32 may protrude into the space area between the memory cells so that a depolarization field may be generated in the space area by the insulating layers 32. Therefore, it may be possible to prevent or reduce the polarization of the ferroelectric layer 34 in the space area.

Each of the memory cells may include the first dielectric layer 37 and the second dielectric layer 39. When the first dielectric layer 37 includes a material with a larger band gap than the ferroelectric layer 34, the gate breakdown voltage of the memory cell may be ensured. In the same manner, when the second dielectric layer 39 includes a material with a larger band gap than the ferroelectric layer 34, the gate breakdown voltage of the memory cell may be ensured.

When the second dielectric layer 39 includes a high-k material, the strength of electric field that is applied to the second dielectric layer 39 may be reduced, and the strength of electric field that is applied to the ferroelectric layer 34 may be increased. Therefore, the voltage level of the operating voltage that is used during a program, read, or erase operation may be reduced, and the memory window may be improved.

Figure 6A:
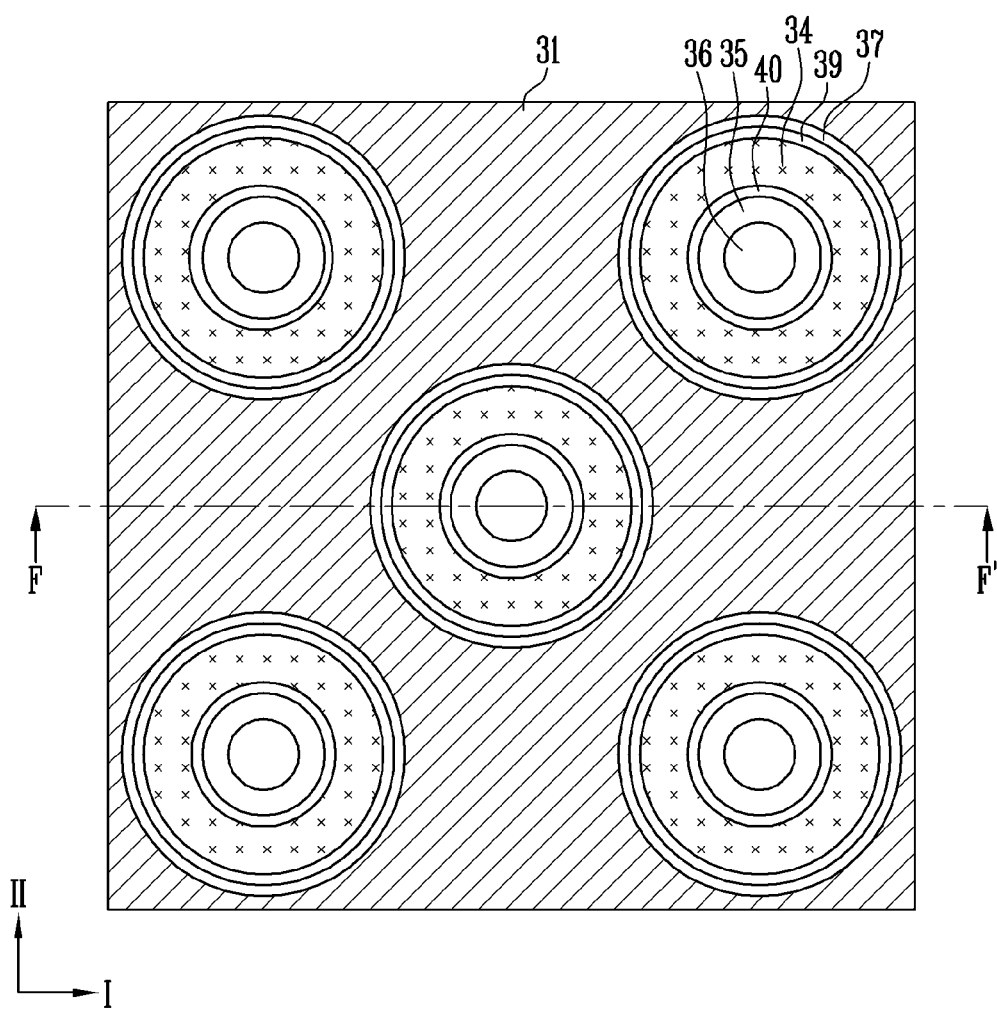
FIGS. 6A to 6C are diagrams, illustrating the structure of a semiconductor device, according to an embodiment of the present disclosure.
Figure 6B:
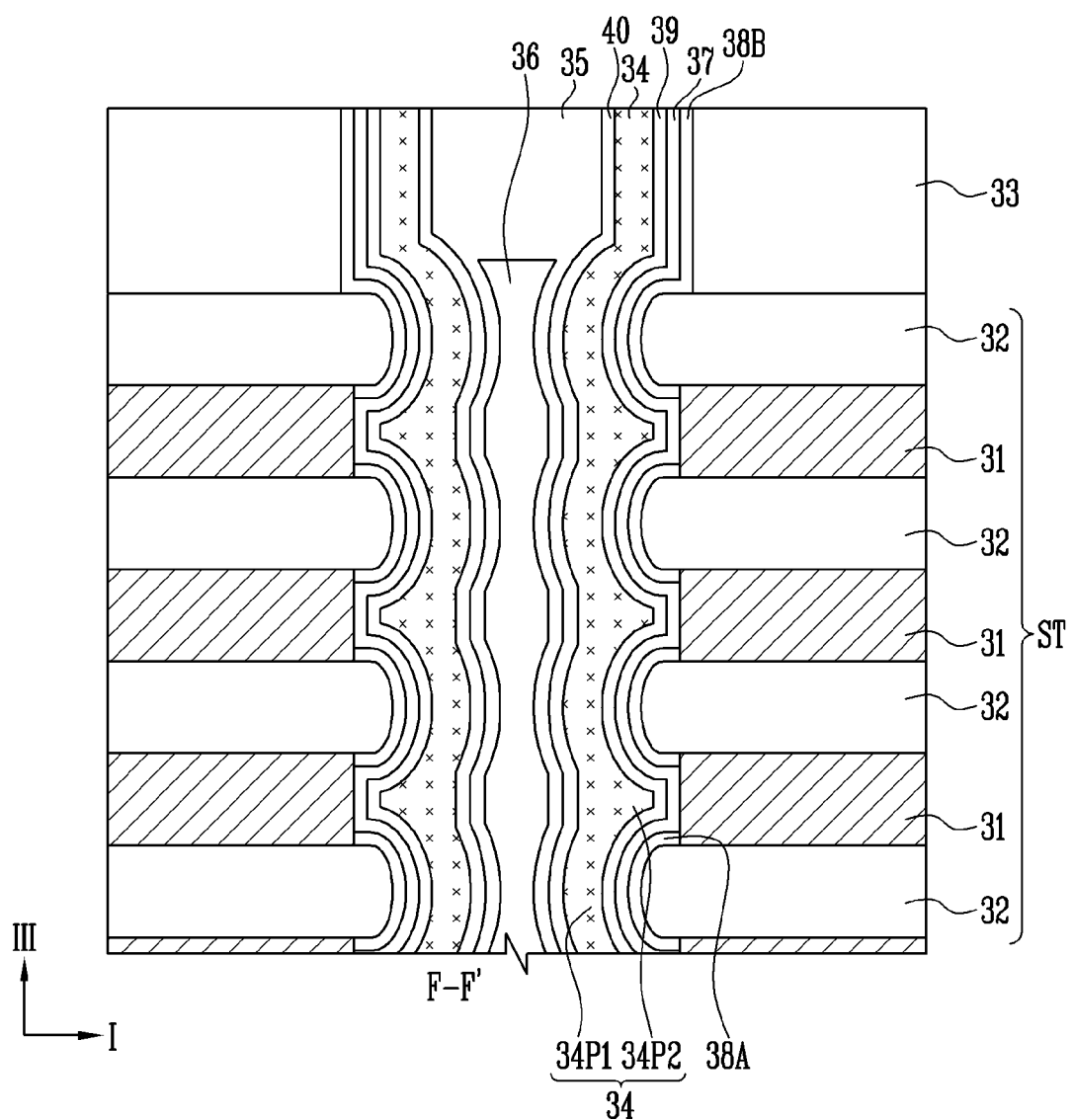
Figure 6C:
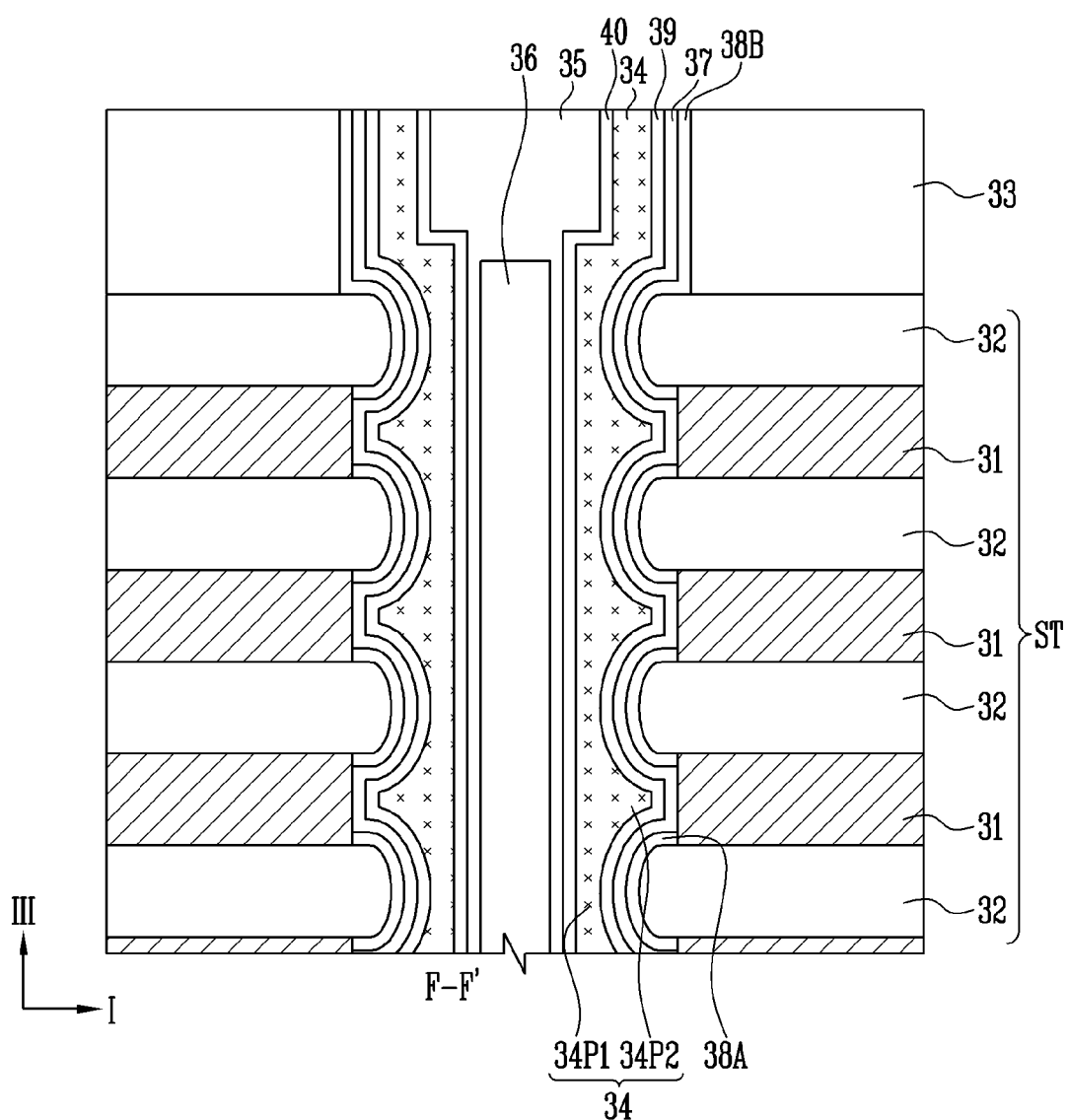

FIGS. 6A to 6C are diagrams, illustrating the structure of a semiconductor device, according to an embodiment of the present disclosure. FIGS. 6B and 6C show F-F' cross-sections of FIG. 6A. Hereinafter, any repetitive detailed description of components that have already been mentioned above will be omitted.

Referring to FIGS. 6A to 6C, the semiconductor device may include the stacked structure ST, the channel layer 35, the ferroelectric layer 34, the first dielectric layer 37 and the sacrificial patterns 38A. The semiconductor device may further include the gap-filling layer 36, the sacrificial pattern 38B, the second dielectric layer 39, a third dielectric layer 40, or a combination thereof.

The third dielectric layer 40 may surround a sidewall of the channel layer 35. The third dielectric layer 40 may be interposed between the channel layer 35 and the ferroelectric layer 34. The adhesion between the ferroelectric layer 34 and the channel layer 35 may be improved by the third dielectric layer 40.

The third dielectric layer 40 may be formed along an inner surface of the ferroelectric layer 34. Referring to FIG. 6B, the inner surface of the ferroelectric layer 34 may have a profile in which the grooves of an outer wall thereof are transferred to the inner surface thereof. The inner surface of the ferroelectric layer 34 may be curved, and the third dielectric layer 40 may be conformally formed along the curved inner surface of the ferroelectric layer 34. Referring to FIG. 6C, the ferroelectric layer 34 may have a flat inner surface. The inner surface of the ferroelectric layer 34 may be an etched surface, and the third dielectric layer 40 may be conformally formed along the flat inner surface.

The third dielectric layer 40 may include substantially the same or different material compared to the second dielectric layer 39. The third dielectric layer 40 may include a material with a higher dielectric constant than the first dielectric layer 37. According to an embodiment, the third dielectric layer 40 may include a high-k material and may include $SiO_2$, $HfO_2$, $ZrO_2$, $La_2O_3$, $TiO_2$, or the like. Alternatively, the third dielectric layer 40 may include a material with a larger band gap than the ferroelectric layer 34. According to an embodiment, the third dielectric layer 40 may include $SiO_2$.

According to the above-described structure, the memory cell may include the first dielectric layer 37 and the second dielectric layer 39, or the first dielectric layer 37 and the third dielectric layer 40, or the first dielectric layer 37, the second dielectric layer 39, and the third dielectric layer 40.

Figure 7A:
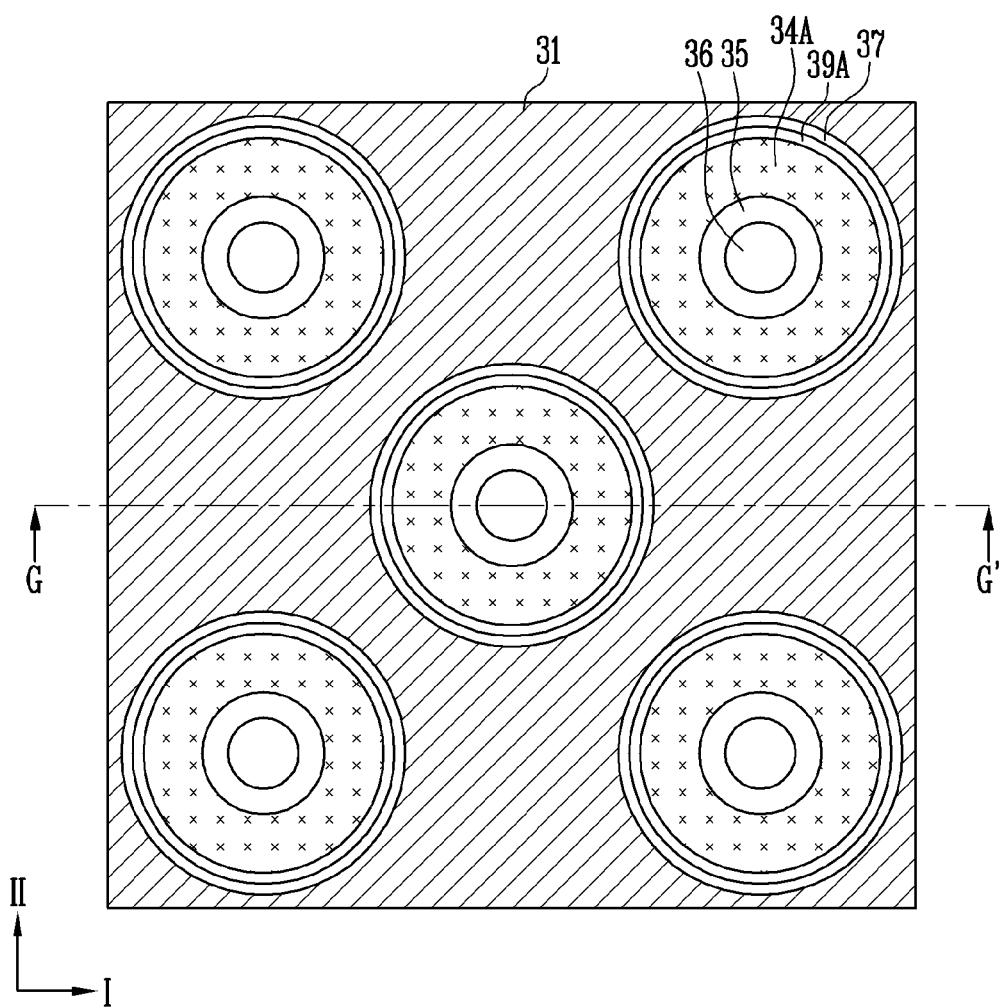
FIGS. 7A and 7B are diagrams, illustrating the structure of a semiconductor device, according to an embodiment of the present disclosure.
Figure 7B:
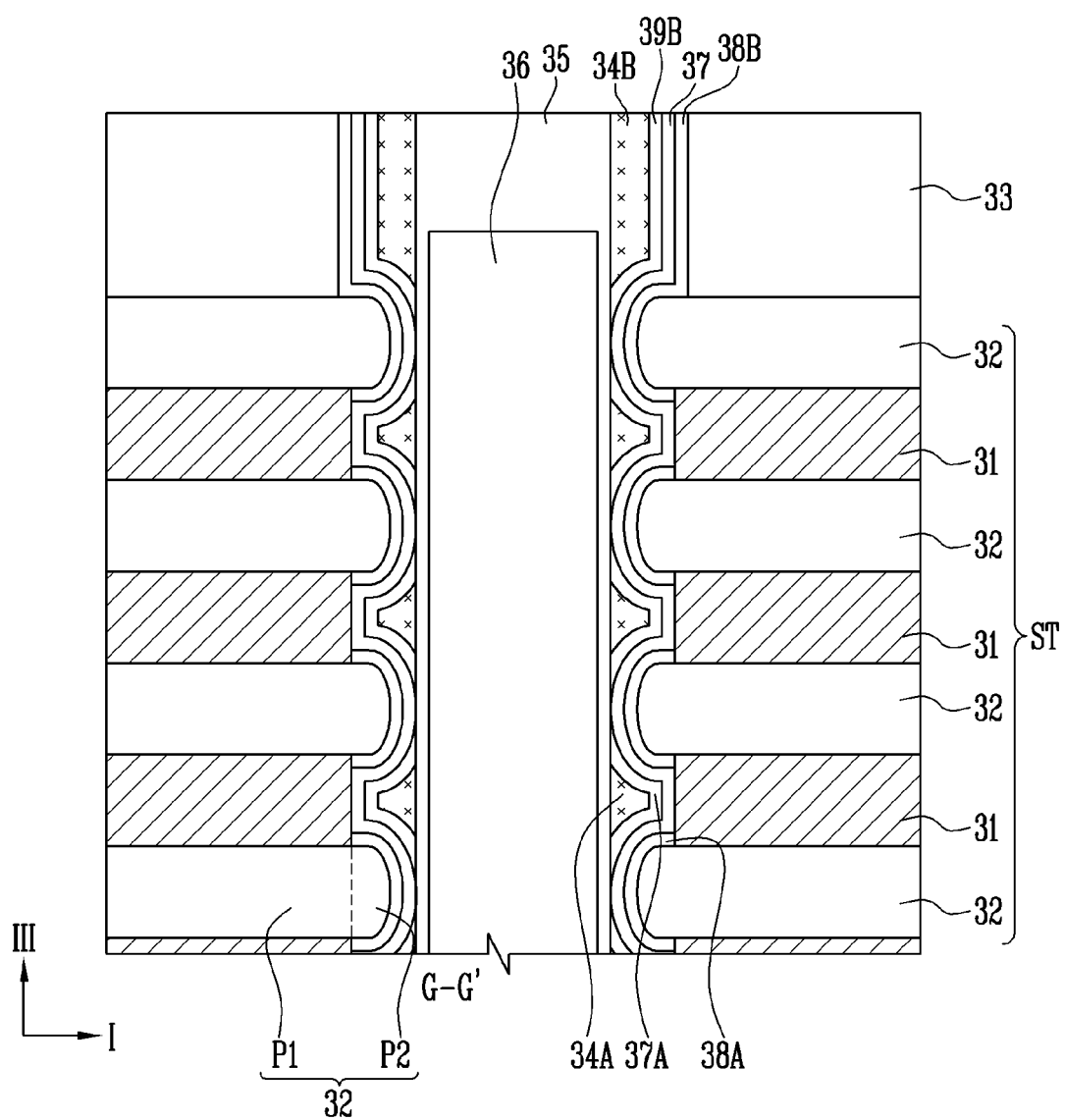

FIGS. 7A and 7B are diagrams, illustrating the structure of a semiconductor device, according to an embodiment of the present disclosure. FIG. 7B shows a G-G' cross-section of FIG. 7A. Hereinafter, any repetitive detailed description of components that have already been mentioned above will be omitted.

Referring to FIGS. 7A and 7B, the semiconductor device may include the stacked structure ST, the channel layer 35, ferroelectric patterns 34A, the first dielectric layer 37 and the sacrificial patterns 38A. The semiconductor device may further include ferroelectric pattern 34B, the gap-filling layer 36, second dielectric patterns 39A, second dielectric patterns 39B, or a combination thereof.

The ferroelectric patterns 34A may be formed to surround a sidewall of the channel layer 35. The ferroelectric patterns 34A may be located at levels that correspond to the conductive layers 31 and may be separated from each other. The first dielectric layer 37 may be interposed between the ferroelectric patterns 34A and the conductive layers 31 and between the channel layer 35 and the insulating layers 32. The ferroelectric pattern 34B may be interposed between the channel layer 35 and the mask pattern 33. The second dielectric pattern 39B may be interposed between the ferroelectric pattern 34B and the first dielectric layer 37.

The insulating layers 32 may be interposed between the conductive layers 31 and may extend between the ferroelectric patterns 34A. The ferroelectric patterns 34A may be located between the second portions P2 of the insulating layers 32, respectively.

According to the above-described structure, the memory cells may include the ferroelectric patterns 34A, respectively. Though not shown, the semiconductor device may further include the third dielectric layer 40, as shown in FIGS. 6A to 6C, which surrounds the sidewall of the channel layer 35.

Figure 8A:
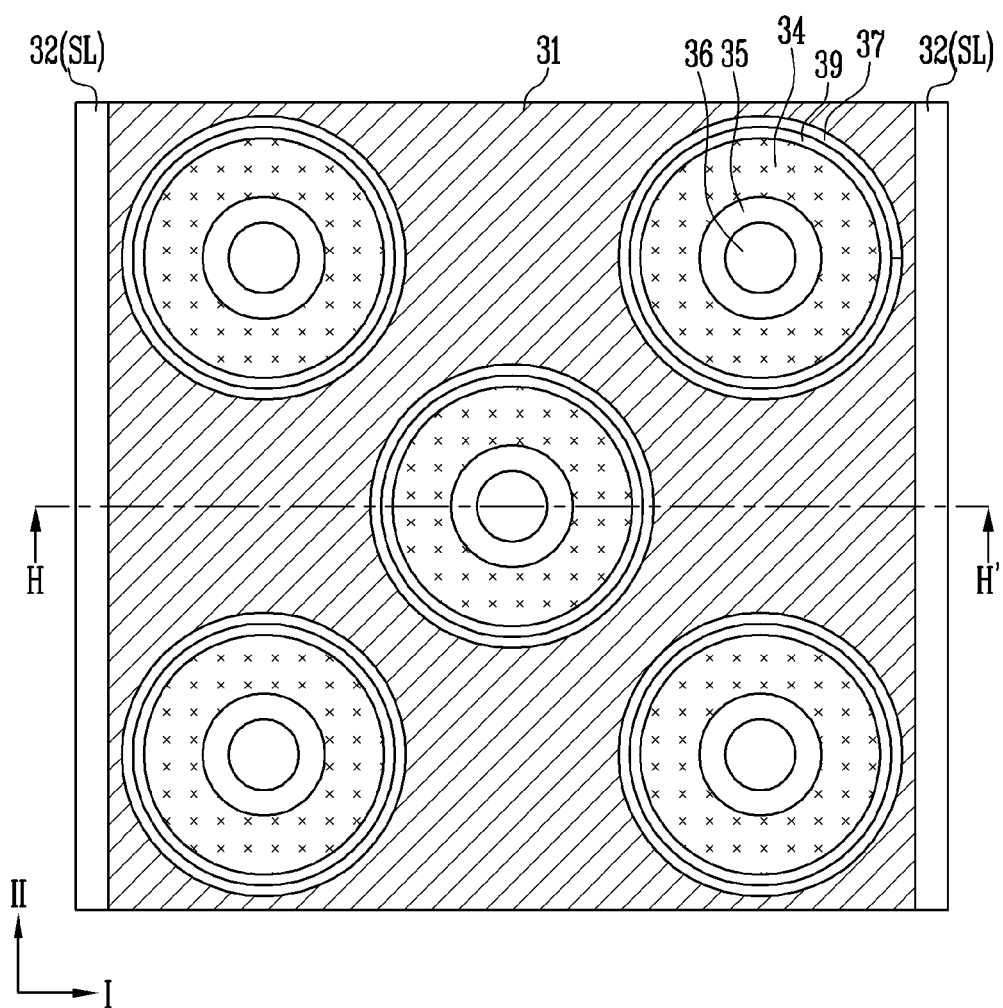
FIGS. 8A and 8B are diagrams, illustrating the structure of a semiconductor device, according to an embodiment of the present disclosure.
Figure 8B:
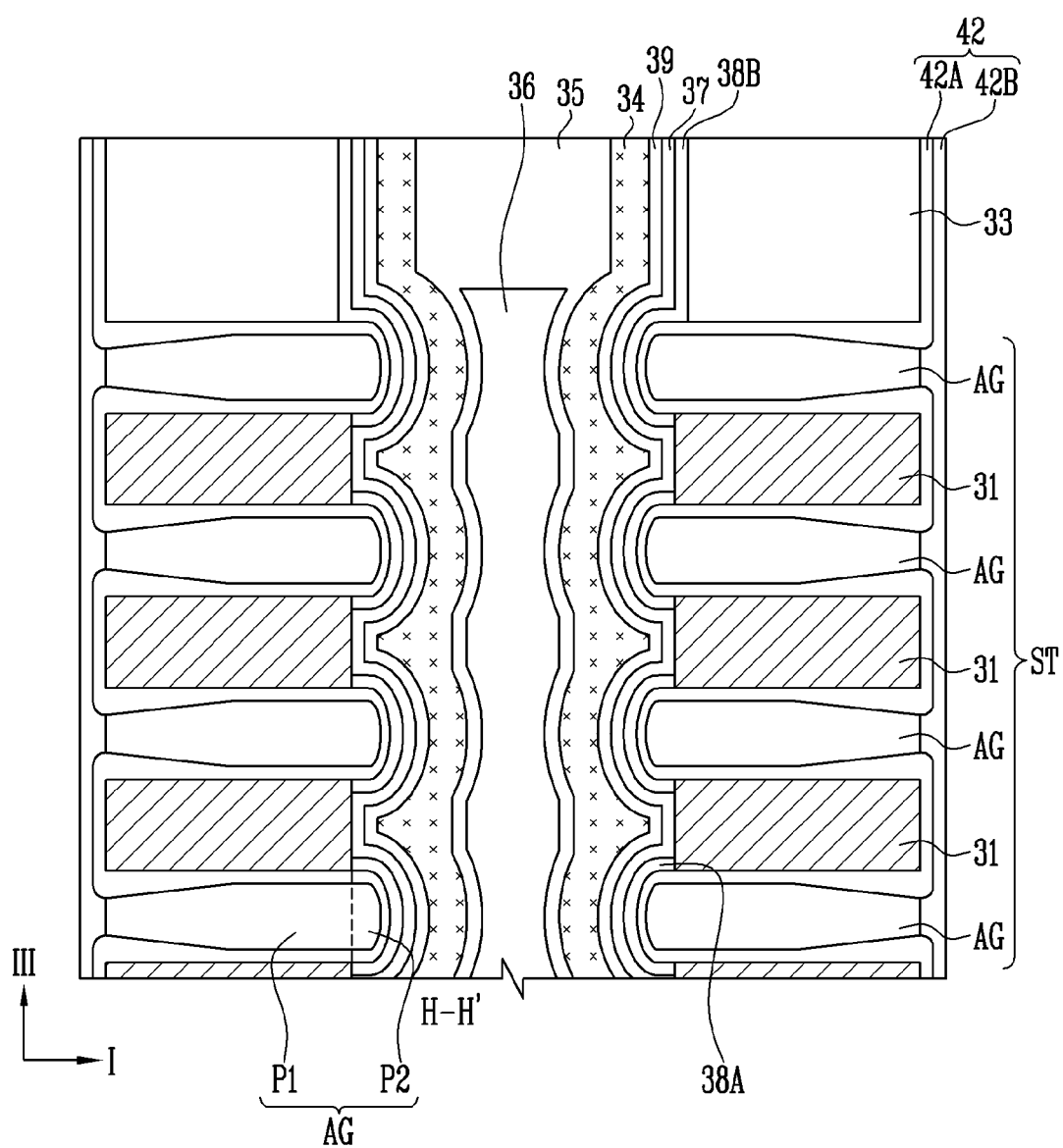

FIGS. 8A and 8B are diagrams, illustrating the structure of a semiconductor device, according to an embodiment of the present disclosure. FIG. 8B shows an H-H' cross-section of FIG. 8A. Hereinafter, any repetitive detailed description of components that have already been mentioned above will be omitted.

Referring to FIGS. 8A and 8B, the semiconductor device may include the stacked structure ST, the channel layer 35, the ferroelectric layer 34, the first dielectric layer 37 and the sacrificial patterns 38A. The semiconductor device may further include the gap-filling layer 36, the sacrificial pattern 38B, the second dielectric layer 39, the air gap AG, a sealing layer 42, or a combination thereof.

The stacked structure ST may include the conductive layers 31 and insulating layers that are stacked alternately with each other. The insulating layers may include the air gaps AG. The insulating layers may be part of the sealing layer 42. The slit SL may pass through the stacked structure ST in the third direction III and the sealing layer 42 may fill at least a portion of the slit SL. The sealing layer 42 may include either or both of a first sealing layer 42A and a second sealing layer 42B. The first sealing layer 42A may fill part of the slit SL and may extend between the stacked conductive layers 31. The second sealing layer 42B may be formed in the slit SL.

The region of the air gap AG may be defined by either or both of the first sealing layer 42A and the second sealing layer 42B. The air gaps AG may be a hollow space that is not filled with material layers and may be filled with air.

Each of the air gaps AG may include the first portion P1, interposed between the conductive layers 31, and the second portion P2, the second portion P2 protruding further toward the channel layer 35 than the conductive layers 31. In the third direction III, the width of the second portion P2 may be substantially the same as or greater than that of the first portion P1.

Each of the sacrificial patterns 38A may surround the second portions P2 of the air gaps AG, respectively. The sacrificial patterns 38A may be interposed between the first dielectric layer 37 and the first sealing layer 42A.

According to the above-described structure, the air gaps AG may be located between the stacked memory cells, and the air gaps AG may protrude farther toward the channel layer 35 than the conductive layers 31. Therefore, a fringe field in a space area between the memory cells may be effectively controlled. Further, the interference between the memory cells as well as a parasitic capacitor between the stacked memory cells may be reduced.

Though not shown, the semiconductor device may further include the third dielectric layer 40, as shown in FIGS. 6A to 6C, which is interposed between the channel layer 35 and the ferroelectric layer 34. In addition, the semiconductor device may include the ferroelectric patterns 34A and 34B as shown in FIGS. 7A and 7B instead of the ferroelectric layer 34, or the second dielectric patterns 39A and 39B as shown in FIGS. 7A and 7B instead of the second dielectric layer 39.

FIGS. 9A to 9E are diagrams, illustrating a method of manufacturing a semiconductor device, according to an embodiment of the present disclosure. Hereinafter, any repetitive detailed description of components that have already been mentioned above will be omitted.

Figure 9A:
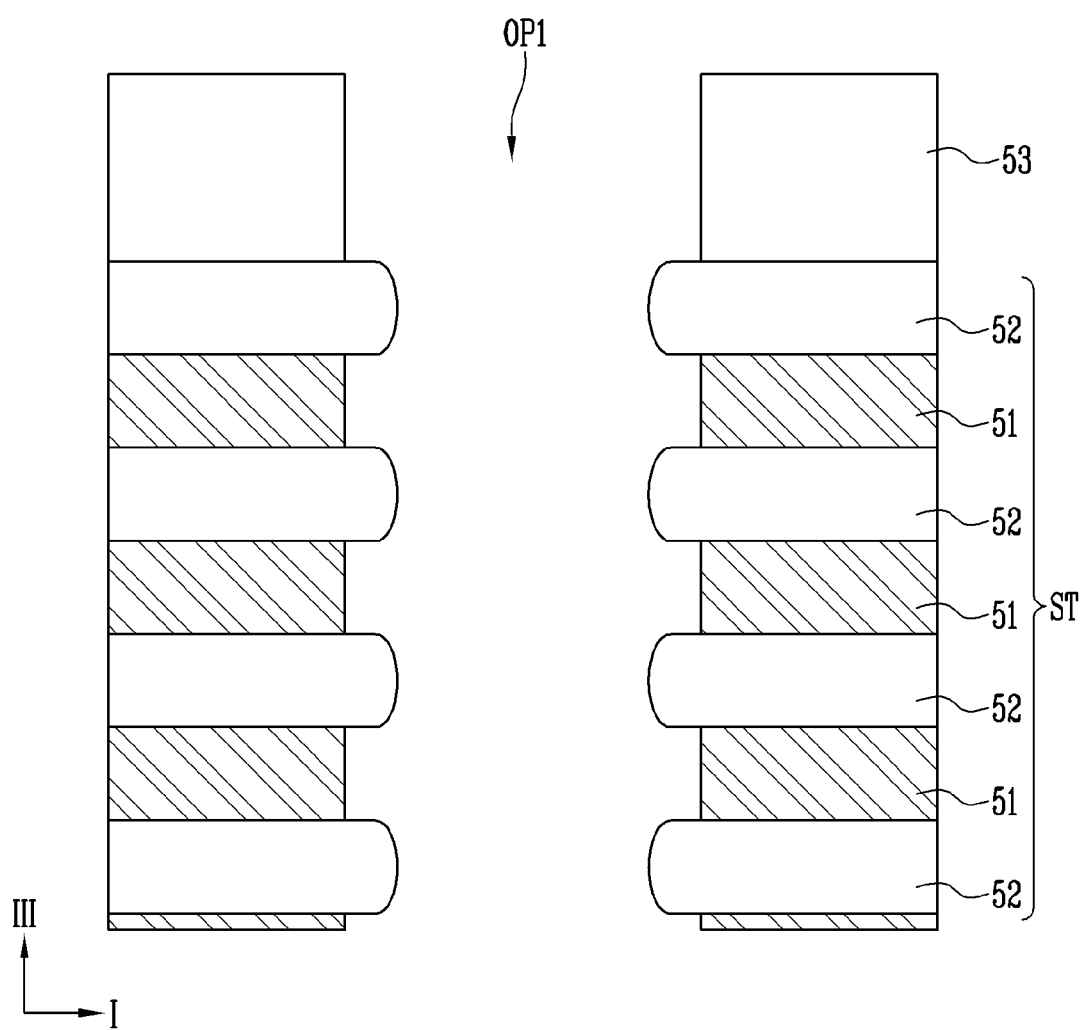
FIGS. 9A to 9E are diagrams, illustrating a method of manufacturing a semiconductor device, according to an embodiment of the present disclosure.

Referring to FIG. 9A, the stacked structure ST may be formed. The stacked structure ST may include first material layers 51 and second material layers 52 that are alternately stacked. The first material layers 51 may include a material with a high etch selectivity with respect to the second material layers 52. For example, the first material layers 51 may include a sacrificial material, such as nitride and the second material layers 52 may include an insulating material, such as oxide. In another example, the first material layers 51 may include a conductive material, such as polysilicon, tungsten, or molybdenum, and the second material layers 52 may include an insulating material, such as oxide.

A first opening OP1 may be formed through the stacked structure ST and may include an inner wall in which the second material layers 52 protrude farther than the first material layers 51.

According to an embodiment, after a mask pattern 53 is formed on the stacked structure ST, the stacked structure ST may be etched by using the mask pattern 53 as an etch barrier to form an opening. A second material may then be selectively deposited on the second material layers 52 exposed through the opening. As a result, the first opening OP1 with the inner wall in which the second material layers 52 protrude farther than the first material layers 51 may be formed. The second material layers 52 may protrude into the first opening OP1 farther than a sidewall of the mask pattern 53. In addition, due to characteristics of the deposition process, the protruding portions of the second material layers 52 may have rounded edges.

According to an embodiment, after the mask pattern 53 is formed on the stacked structure ST, the stacked structure ST may be etched by using the mask pattern 53 as an etch barrier to form an opening. The first material layers 51 that is exposed through the opening may be selectively etched. Accordingly, the first opening OP1 with the inner wall in which the second material layers 52 protrude farther than the first material layers 51 may be formed. Thus, the sidewalls of the second material layers 52 may be aligned with the sidewall of the mask pattern 53. The sidewalls of the first material layers 51 may be separated from the first opening OP1 more than the sidewall of the mask pattern 53. In addition, during an etch process, an electric field may be concentrated around the protruding edges of the second material layers 52, so that the edges may be rounded.

Figure 9B:
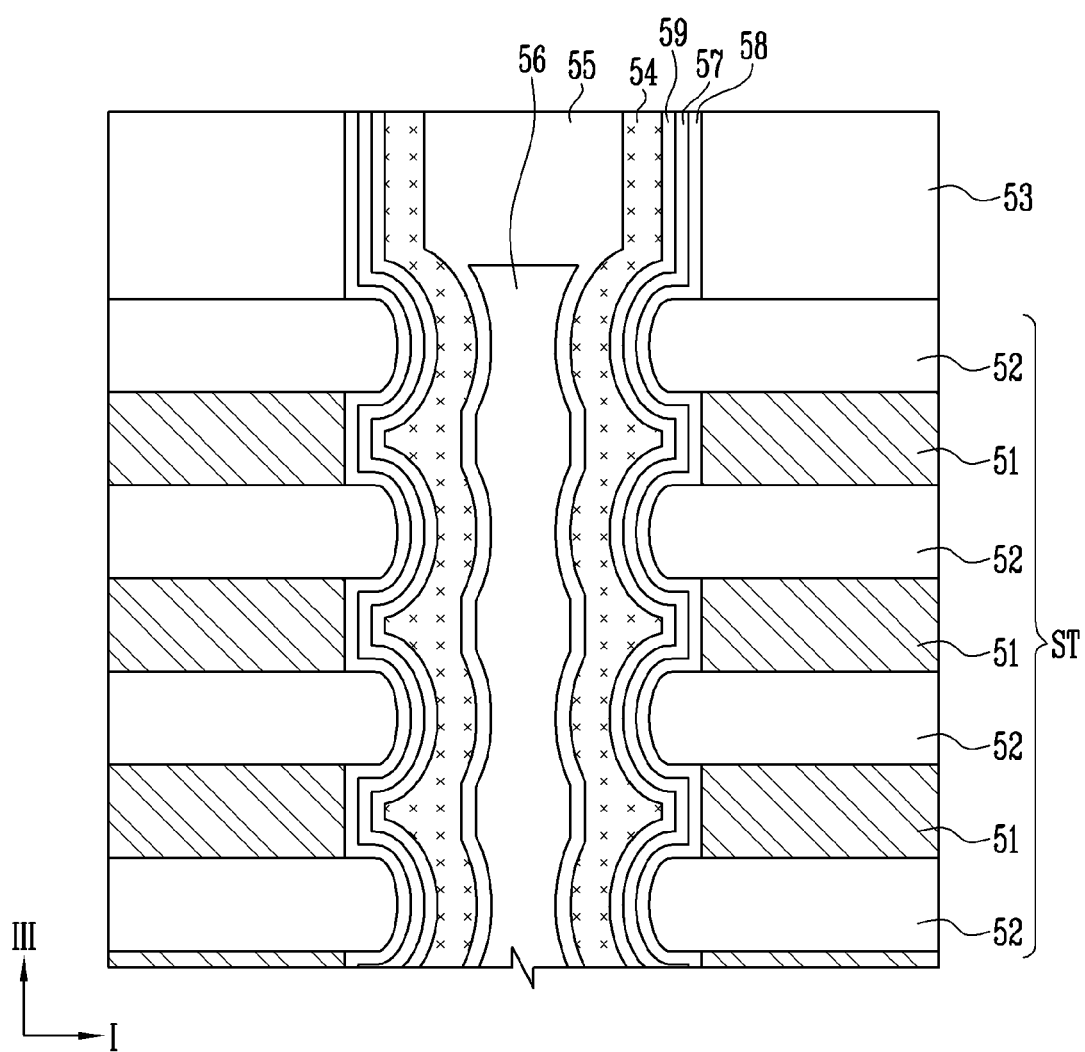

Referring to FIG. 9B, a sacrificial layer 58 may be formed in the first opening OP1. The sacrificial layer 58 may be conformally formed along an inner surface of the first opening OP1. The sacrificial layer 58 may serve as a protective layer during subsequent processes. The sacrificial layer 58 may include a material with a high etch selectivity with respect to the first material layers 51 and the second material layers 52. The sacrificial layer 58 may include a high-k material and may include titanium (Ti), zirconium (Zr), or hafnium (Hf). According to an embodiment, the sacrificial layer 58 may include a high-k material that is doped with silicon (Si).

A first dielectric layer 57 may be formed in the sacrificial layer 58, a ferroelectric layer 54 may be formed in the first dielectric layer 57, and a channel layer 55 may be formed in the ferroelectric layer 54. The ferroelectric layer 54 may include a curved or flat inner surface. However, after the inner surface of the ferroelectric layer 54 is etched to a predetermined thickness, the channel layer 55 may be formed. The sacrificial layer 58 may include a material with a higher dielectric constant than the first dielectric layer 57. The first dielectric layer 57 may include a material with a larger band gap than the ferroelectric layer 54. The first dielectric layer 57 may include oxide, such as silicon oxide ($SiO_2$).

Before the ferroelectric layer 54 is formed, a second dielectric layer 59 may be formed in the first dielectric layer 57. The second dielectric layer 59 may include a material with a higher dielectric constant than the first dielectric layer 57. According to an embodiment, the second dielectric layer 59 may include a high-k material and may include $SiO_2$, $HfO_2$, $ZrO_2$, $La_2O_3$, $TiO_2$, or the like. Alternatively, the second dielectric layer 59 may include a material with a larger band gap than the ferroelectric layer 54. According to an embodiment, the second dielectric layer 59 may include $SiO_2$.

In addition, though not shown, before the channel layer 55 is formed, a third dielectric layer may be formed in the ferroelectric layer 54. The third dielectric layer may include a material with a larger band gap than the ferroelectric layer 54, or a material with a higher dielectric constant than the first dielectric layer 57.

A gap-filling layer 56 may be included in the channel layer 55. According to an embodiment, after a channel material is formed in the ferroelectric layer 54, the gap-filling layer 56 may be formed in the channel material. The gap-filling layer 56 may then be partially etched, and the channel material may be additionally formed in the area from which the gap-filling layer 56 is etched, thereby forming the channel layer 55.

Figure 9C:
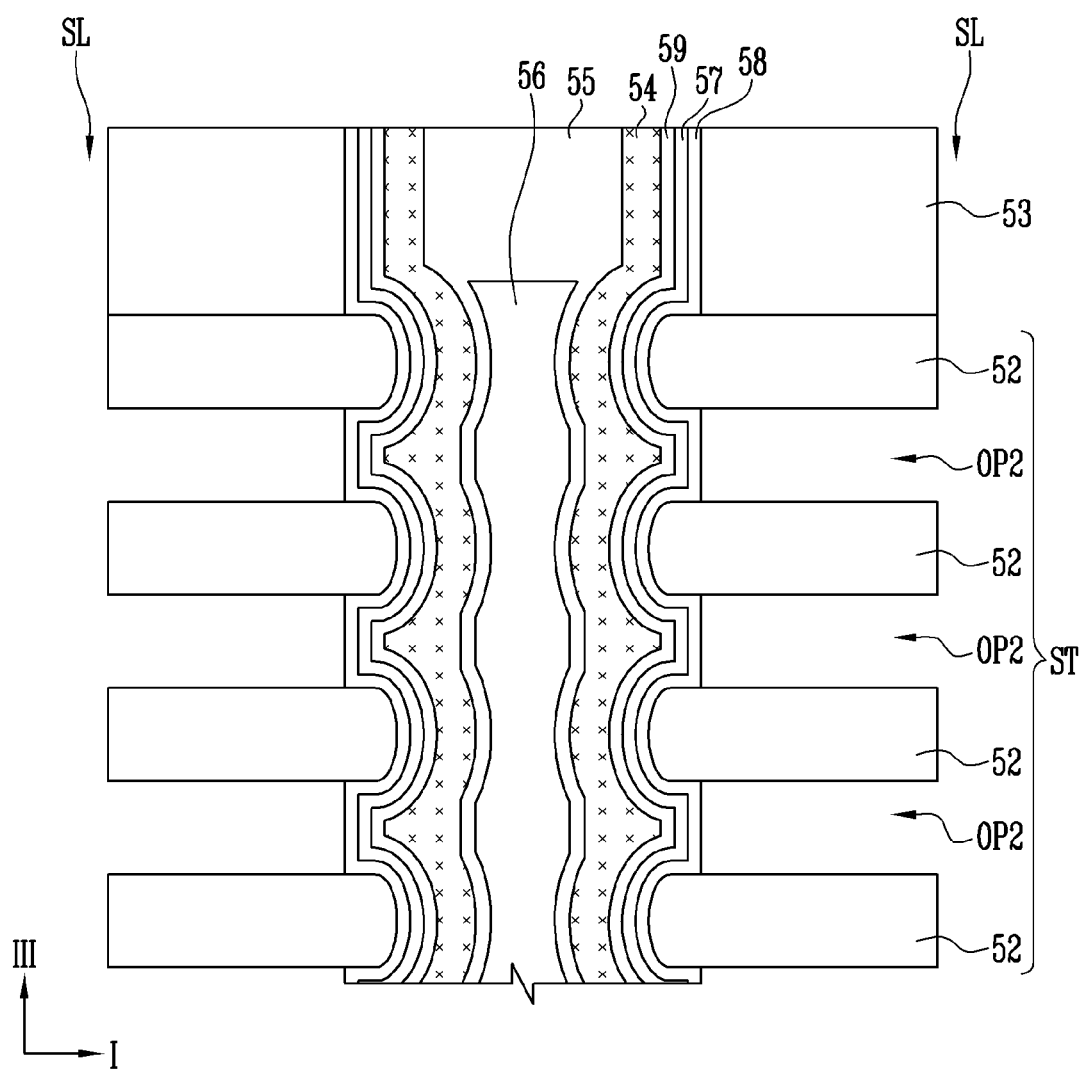

Referring to FIG. 9C, the slit SL may pass through the mask pattern 53 and the stacked structure ST. Subsequently, second openings OP2 may be formed by selectively etching the first material layers 51 through the slit SL. The first material layers 51 may be etched under the condition that the first material layers 51 include a material with a high etch selectivity with respect to the sacrificial layer 58 and the second material layers 52. Therefore, the first dielectric layer 57 may be protected by the sacrificial layer 58.

Figure 9D:
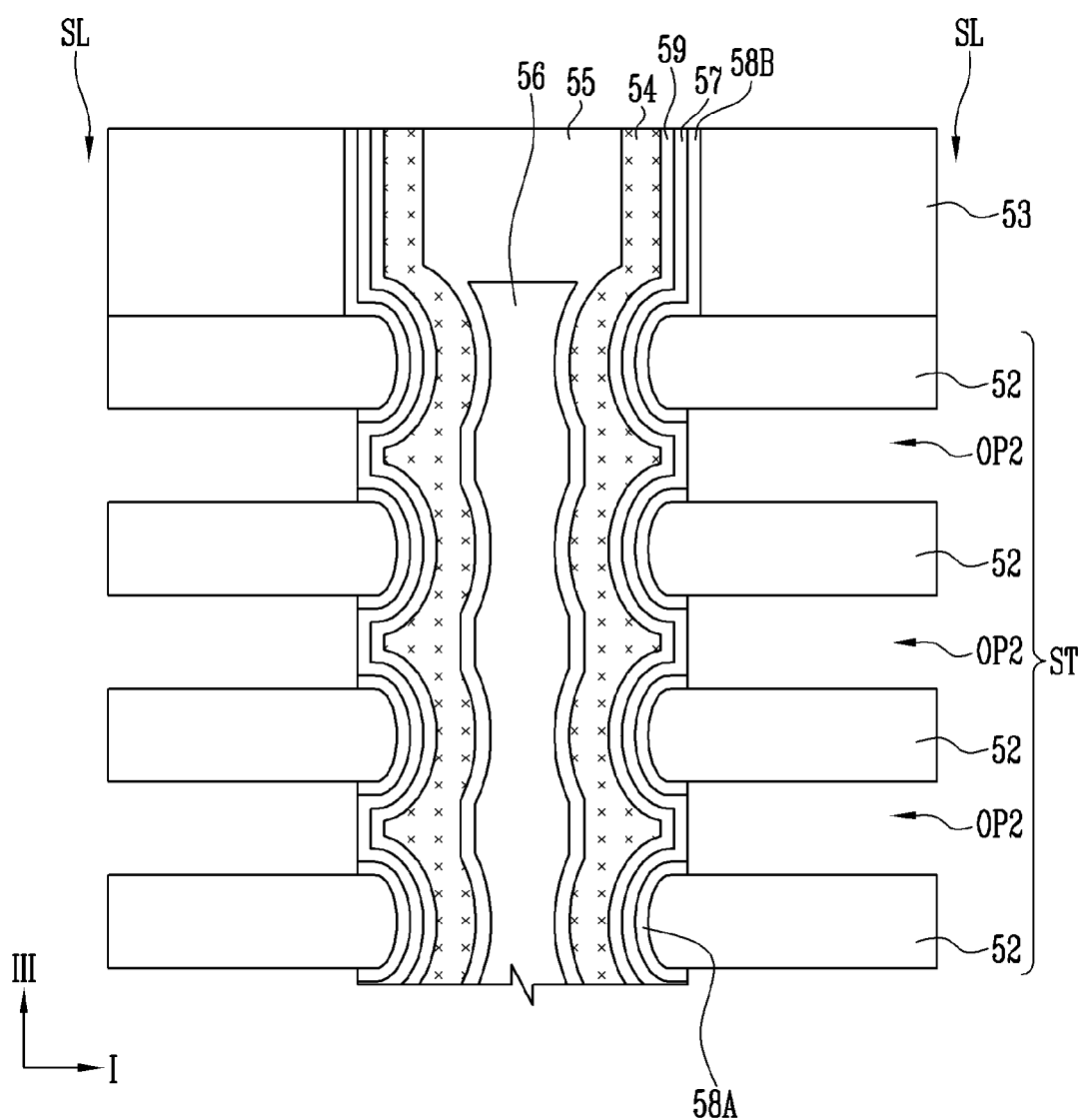

Referring to FIG. 9D, the sacrificial layer 58 may be selectively etched through the second openings OP2 so as to expose the first dielectric layer 57. As a result, portions of the sacrificial layer 58 at positions that correspond to the second material layers 52 may remain to form sacrificial patterns 58A. A portion of the sacrificial layer 58 at a position that corresponds to the mask pattern 53 may also remain to form a sacrificial pattern 58B.

Figure 9E:
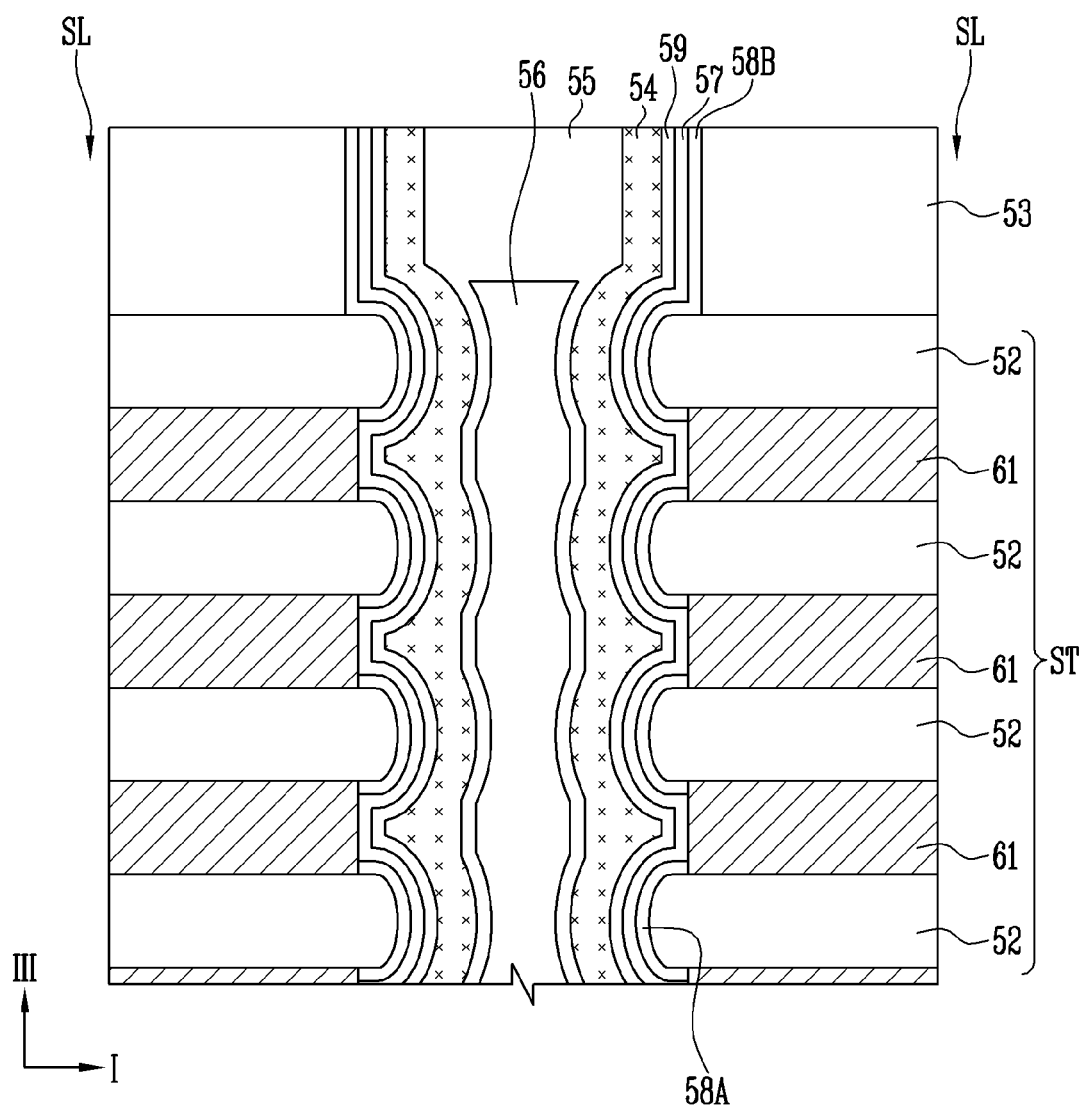

Referring to FIG. 9E, conductive layers 61 may be formed in the second opening OP2. According to an embodiment, the conductive layers 61, including a metal, such as tungsten or molybdenum may be formed. Before the conductive layers 61 are formed, a barrier layer that is formed of titanium nitride, tantalum nitride, or tungsten nitride may be formed in the second openings OP2.

According to the above-described manufacturing method, memory cells with the ferroelectric layer 54 may be formed. The stacked memory cells may share the ferroelectric layer 54. The second material layers 52 may be located between the stacked memory cells and may protrude farther toward the channel layer 55 than the conductive layers 61.

Figure 10A:
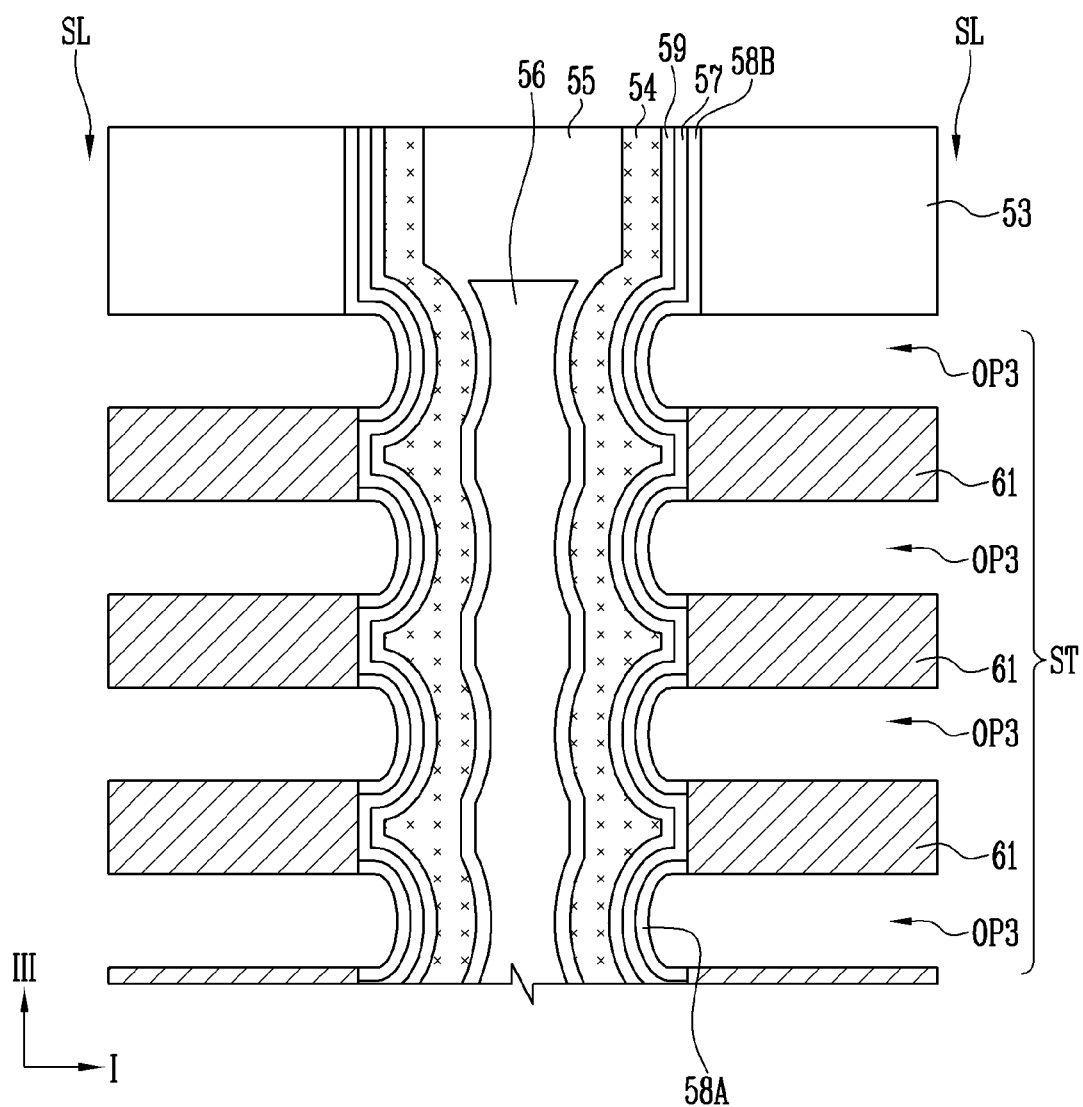
FIGS. 10A to 10C are diagrams, illustrating a method of manufacturing a semiconductor device, according to an embodiment of the present disclosure.
Figure 10B:
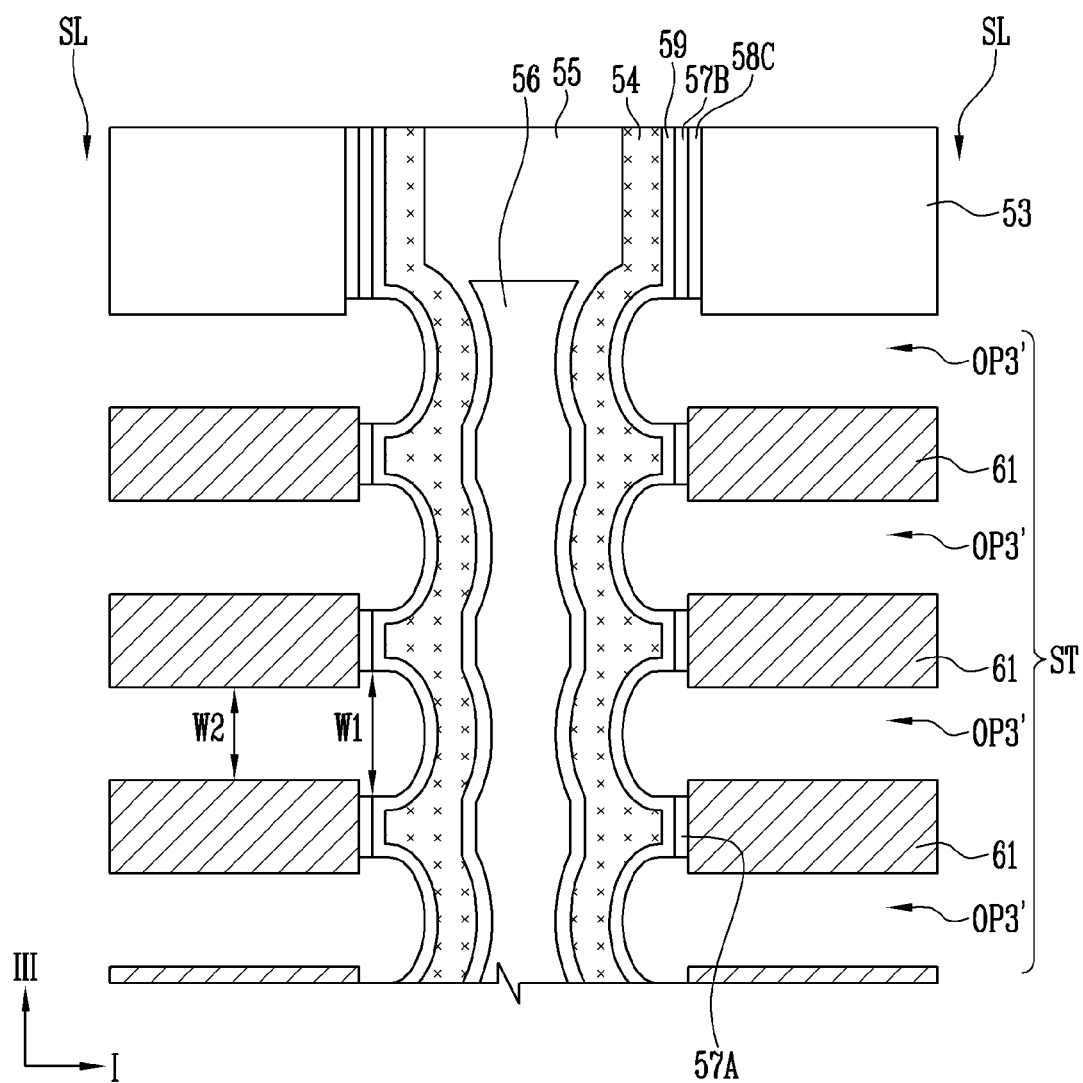
Figure 10C:
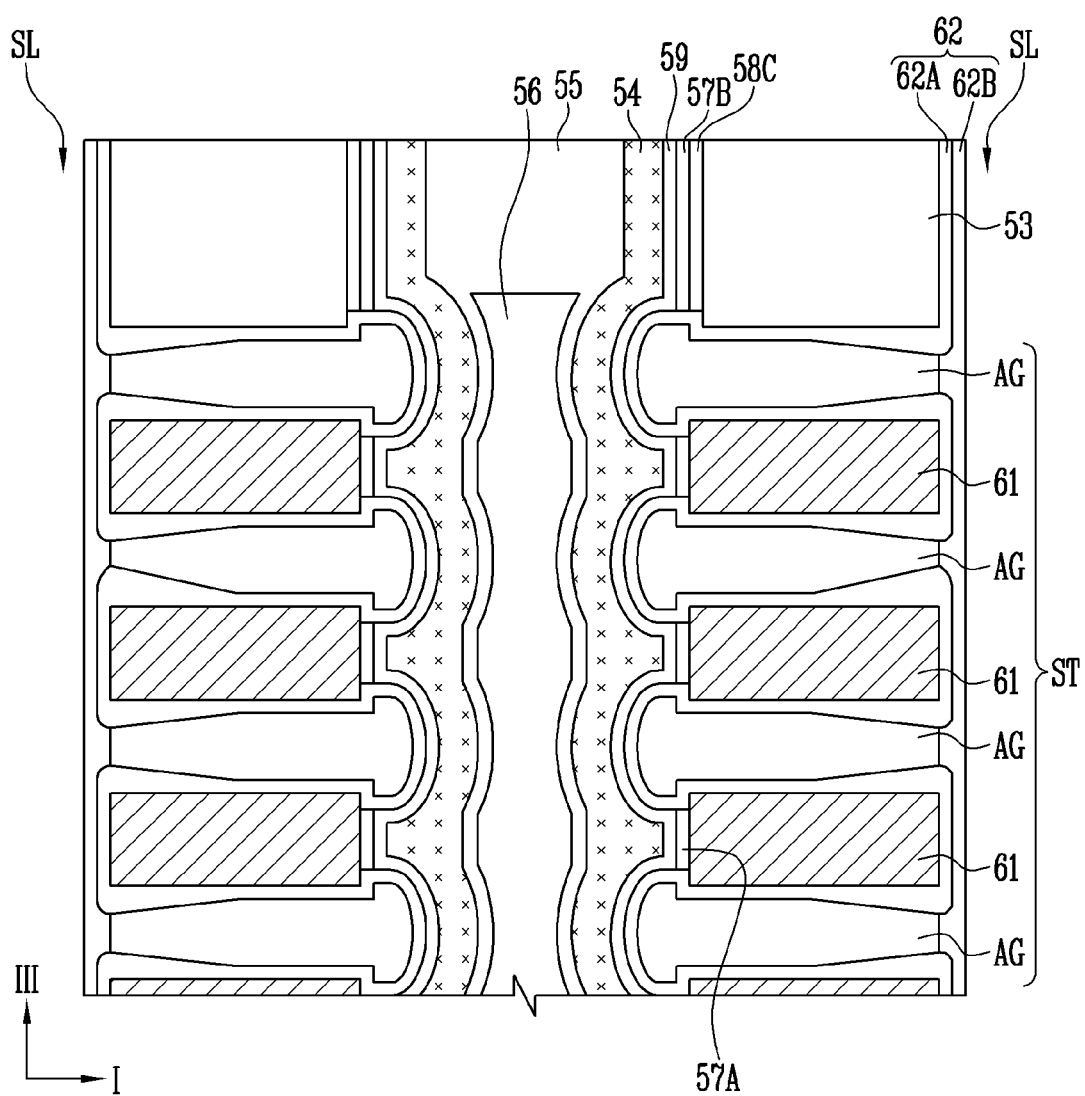

FIGS. 10A to 10C are diagrams, illustrating a method of manufacturing a semiconductor device, according to an embodiment of the present disclosure. Hereinafter, any repetitive detailed description of components that have already been mentioned above will be omitted.

FIGS. 10A to 10C are views, illustrating performed processes subsequent to the manufacturing processes as described above with reference to FIGS. 9A to 9E. Referring to FIG. 10A, third openings OP3 may be formed by selectively etching the second material layers 52 through the slit SL. The second material layers 52 may be etched under the condition that the second material layers 52 have a high etch selectivity with respect to the sacrificial patterns 58A and 58B and the conductive layers 61. Therefore, the first dielectric layer 57 may be protected by the sacrificial patterns 58A and 58B.

Referring to FIG. 10B, the sacrificial patterns 58A and 58B may be selectively etched through the third openings OP3 so as to expose the first dielectric layer 57. Therefore, the sacrificial patterns 58A may be removed and the first dielectric layer 57 may be exposed. In addition, a portion of the sacrificial pattern 58B that is exposed through the third opening OP3 may be etched to form a sacrificial pattern 58C. The sacrificial pattern 58C may be interposed between the channel layer 54 and the mask pattern 53.

The first dielectric layer 57 may be selectively etched through the third openings OP3. The portions of the first dielectric layer 57 that are exposed through the third openings OP3 may be etched, and the second dielectric layer 59 or the ferroelectric layer 54 may be exposed. A portion of the first dielectric layer 57 that is interposed between the ferroelectric layer 54 and the conductive layers 61 may remain to form first dielectric patterns 57A. A portion of the first dielectric layer 57 that is interposed between the ferroelectric layer 54 and the mask pattern 53 may remain to form a first dielectric pattern 57B.

As the sacrificial patterns 58A and 58B and the first dielectric layer 57 are etched, the third opening OP3 may be extended. Each of the extended third openings OP3' may have a uniform width or a varying width based on an area thereof. According to an embodiment, each of the extended third openings OP3' may have a first width W1 between the first dielectric patterns 57A and a second width W2 between the conductive layers 61. The first width W1 may be greater than the second width W2.

Though not shown, the second dielectric layer 59 that is exposed through the third openings OP3' may be etched. As a result, portions of the second dielectric layer 59 that are exposed through the third openings OP3' may be removed, and the second dielectric layer 59 may remain only between the ferroelectric layer 54 and the conductive layers 61. Alternatively, the second dielectric layer 59 and the ferroelectric layer 54 that are exposed through the third openings OP3' may be etched. Thus, the ferroelectric layer 54 and the second dielectric layer 59 may remain only between the channel layer 55 and the conductive layers 61.

Referring to FIG. 10C, the air gaps AG may be formed in the third openings OP3' by sealing the third openings OP3'. According to an embodiment, by forming a sealing layer 62 in the slit SL, the air gaps AG may be formed in the third openings OP3', respectively. The sealing layer 62 may include an insulating material, such as oxide. The sealing layer 62 may include a first sealing layer 62A and may further include a second sealing layer 62B.

The first sealing layer 62A may be formed along inner surfaces of the slit SL and the third openings OP3'. The first sealing layer 62A may be interposed between the conductive layers 61 and between the first dielectric patterns 57A. The first sealing layer 62A may contact the second dielectric layer 59 or the ferroelectric layer 54.

The first sealing layer 62A may be formed through a deposition process. The first sealing layer 62A may have a uniform thickness or a varying thickness based on an area thereof. The first sealing layer 62A may have a relatively great thickness at portions in which the third openings OP3' are coupled to the slit SL. In each of the third openings OP3', the first sealing layer 62A may have an inclined inner surface. At least some of the third openings OP3' may be sealed by the first sealing layer 62A.

However, when the third openings OP3' that are not sealed by the first sealing layer 62A exist, the second sealing layer 62B may be additionally formed. The second sealing layer 62B may be formed along an inner surface of the slit SL. Based on circumstances, the second sealing layer 62B may extend into the third openings OP3'.

According to the above-described manufacturing method, memory cells with the ferroelectric layer 54 may be formed. In addition, the air gaps AG may be located between the stacked memory cells and may protrude farther toward the channel layer 55 than the conductive layers 61.

FIGS. 11A to 11D are diagrams, illustrating a method of manufacturing a semiconductor device, according to an embodiment of the present disclosure. Hereinafter, any repetitive detailed description of components that have already been mentioned above will be omitted.

Figure 11A:
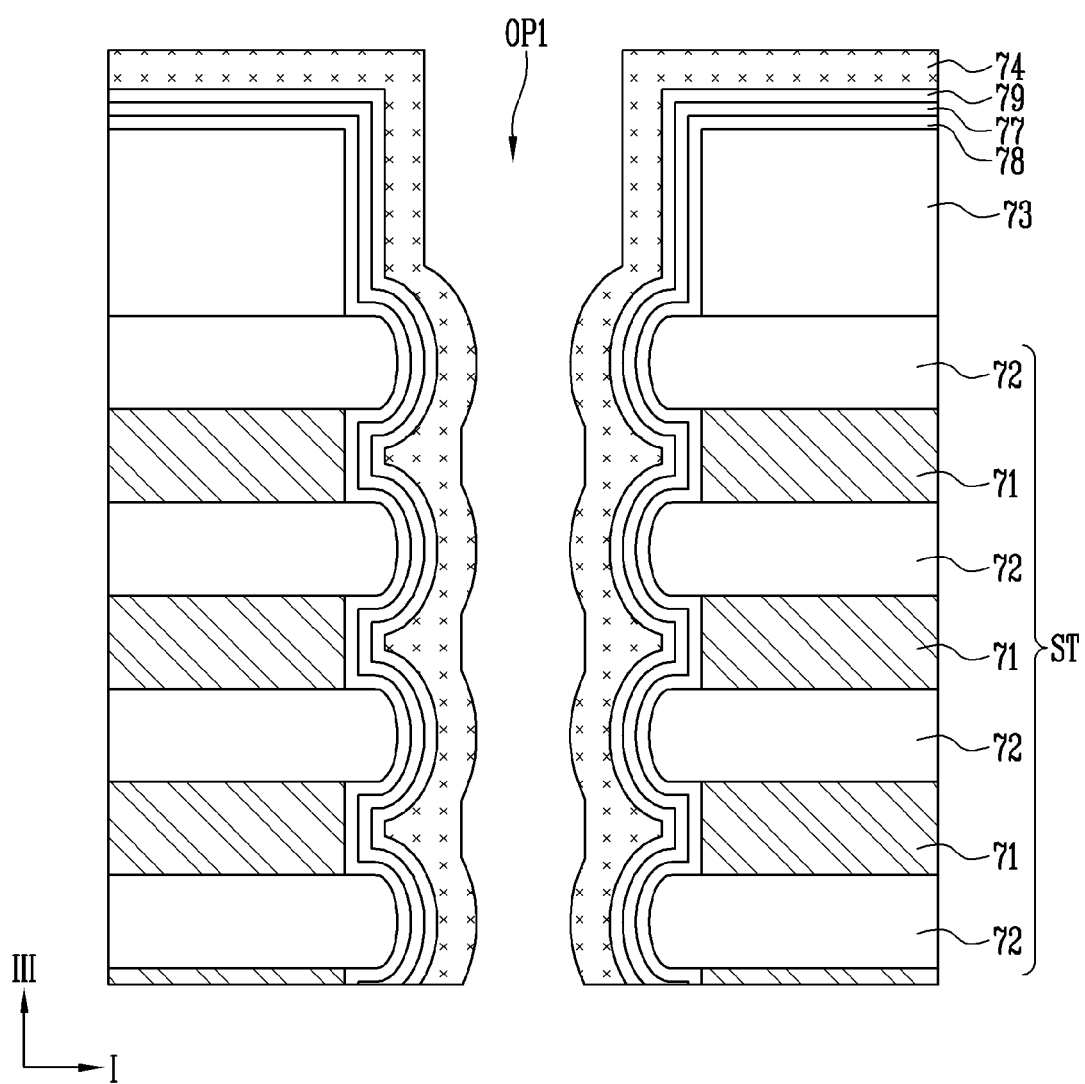
FIGS. 11A to 11D are diagrams, illustrating a method of manufacturing a semiconductor device, according to an embodiment of the present disclosure.

Referring to FIG. 11A, the stacked structure ST may be formed. The stacked structure ST may include first material layers 71 and second material layers 72 which are alternately stacked. The first material layers 71 may include a material with a high etch selectivity with respect to the second material layers 72. The first opening OP1 may be formed through the stacked structure ST and may include an inner wall in which the second material layers 72 protrude farther than the first material layers 71.

Subsequently, a sacrificial layer 78 may be formed in the first openings OP1. The sacrificial layer 78 may include a material with a high etch selectivity with respect to the first material layers 71 and the second material layers 72. A first dielectric layer 77 may be formed in the sacrificial layer 78 and a ferroelectric layer 74 may be formed in the first dielectric layer 77. The sacrificial layer 78 may include a material with a higher dielectric constant than the first dielectric layer 77. The first dielectric layer 77 may include a material with a larger band gap than the ferroelectric layer 74. The sacrificial layer 78, the first dielectric layer 77, and the ferroelectric layer 74 may also be formed on an upper surface of a mask pattern 73.

Before the ferroelectric layer 74 is formed, a second dielectric layer 79 may be formed in the first dielectric layer 77. The second dielectric layer 79 may include a material with a higher dielectric constant than the first dielectric layer 77. Alternatively, the second dielectric layer 79 may include a material with a larger band gap than the ferroelectric layer 74.

Figure 11B:
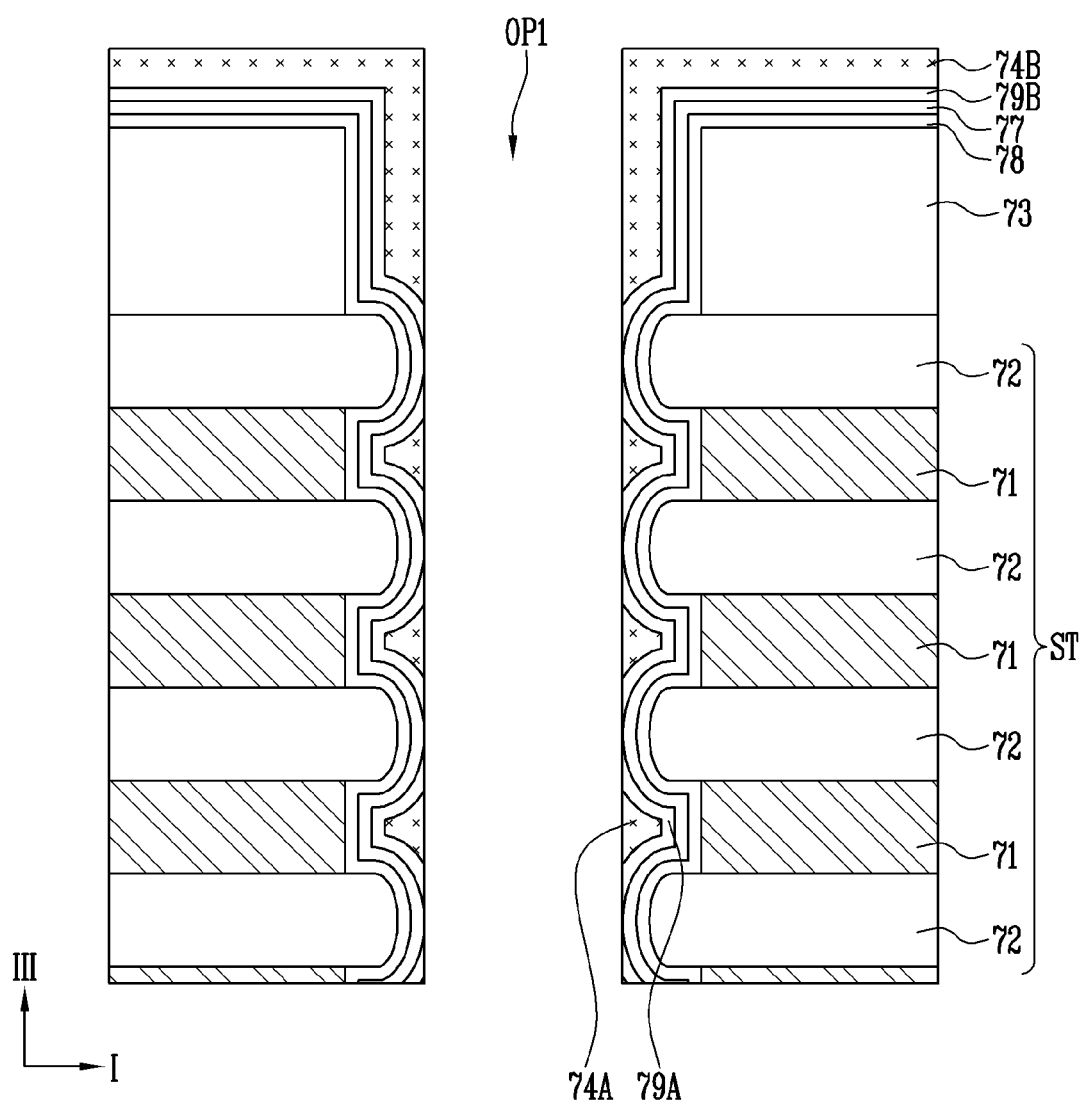

Referring to FIG. 11B, ferroelectric patterns 74A and 74B may be formed by etching the ferroelectric layer 74. Without by using a separate mask pattern, the ferroelectric layer 74 may be etched based on a full etch-back method. A portion of the ferroelectric layer 74 that relatively protrudes into the first opening OP1 may be etched. The ferroelectric patterns 74A may be formed between the protruding second material layers 72. In addition, the ferroelectric pattern 74B may be formed on a sidewall of the mask pattern 73.

The second dielectric layer 79 may be exposed when the ferroelectric layer 74 is etched. The exposed second dielectric layer 79 may be etched to thereby form second dielectric patterns 79A and 79B. The second dielectric patterns 79A may be located between the protruding second material layers 72. The second dielectric patterns 79A may surround the ferroelectric patterns 74A, respectively, and may have a C-shaped cross-section. The second dielectric pattern 79B may be formed on the sidewall of the mask pattern 73 and interposed between the ferroelectric pattern 74B and the first dielectric layer 77.

Though not shown, a third dielectric layer may be formed in the first opening OP1. The third dielectric layer may include a material with a larger band gap than the ferroelectric layer 74 or a material with a higher dielectric constant than the first dielectric layer 77.

Figure 11C:
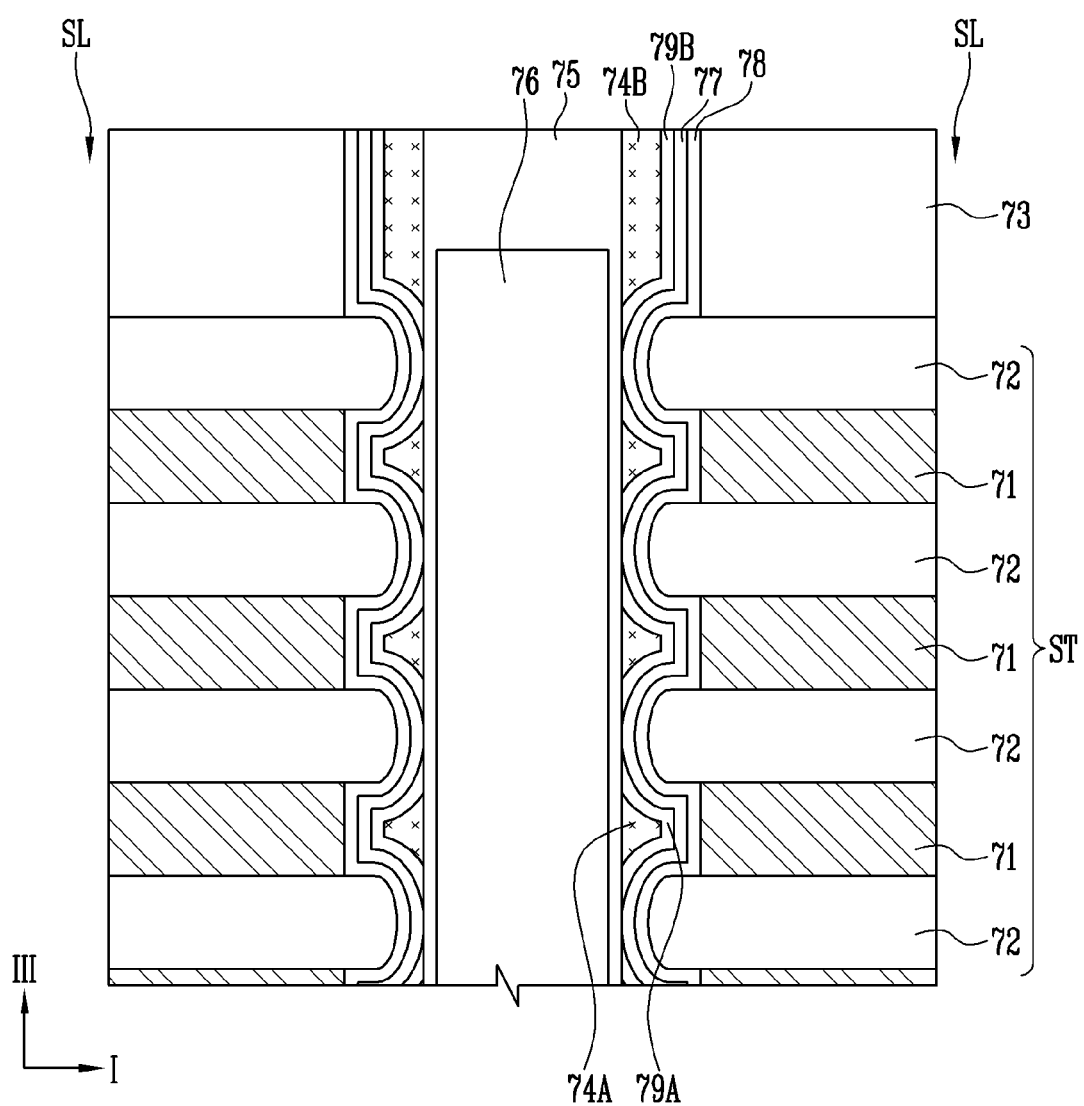

Referring to FIG. 11C, a channel layer 75 and a gap-filling layer 76 may be formed in the first opening OP1. The slit SL may be formed through the mask pattern 73 and the stacked structure ST. Subsequently, the second openings OP2 may be formed by selectively etching the first material layers 71 through the slit SL. The first material layers 71 may be etched under the condition that the first material layers 71 include a material with a high etch selectivity with respect to the sacrificial layer 78 and the second material layers 72.

Figure 11D:
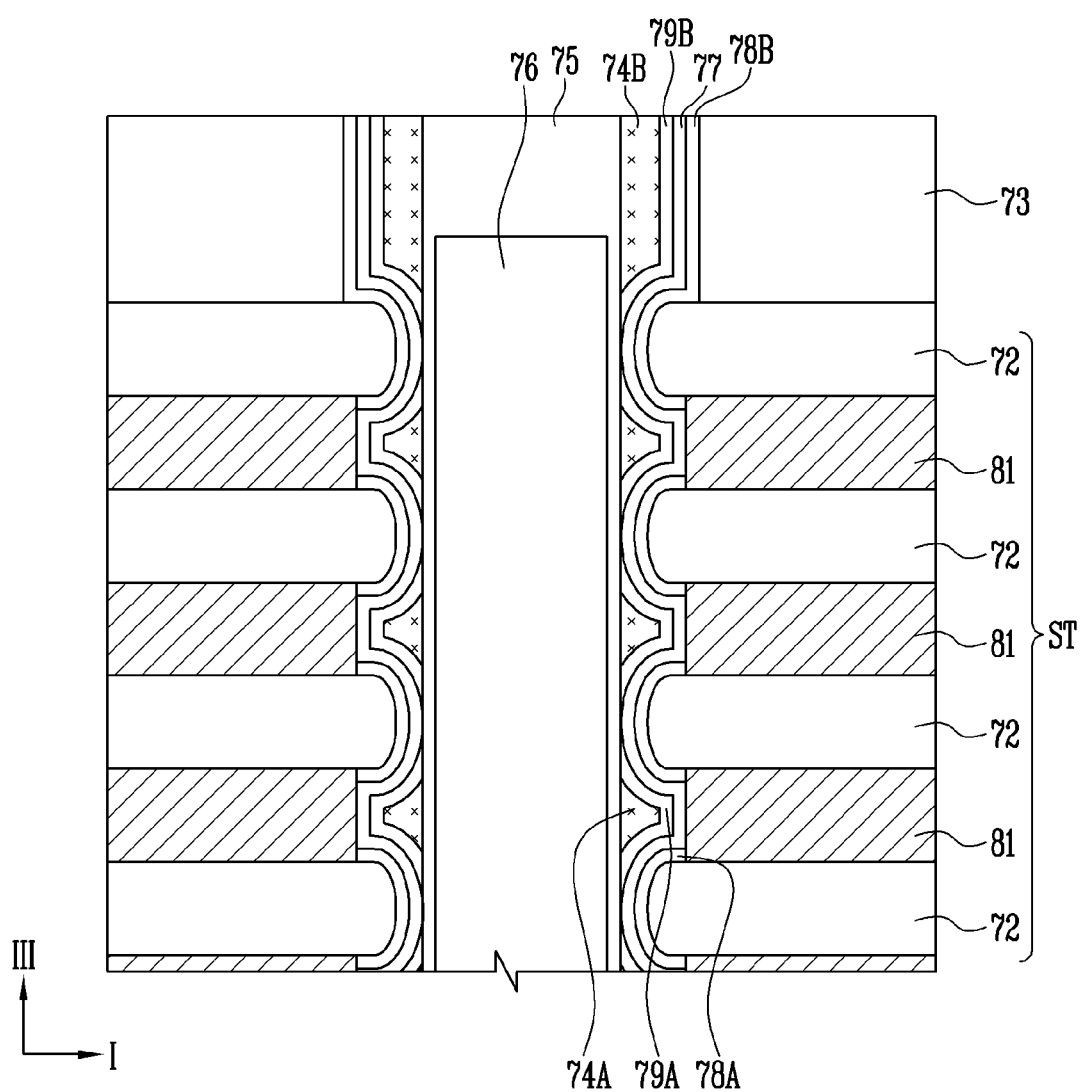

Referring to FIG. 11D, sacrificial patterns 78A and 78B may be formed by selectively etching the sacrificial layer 78 through the second openings OP2. As a result, the first dielectric layer 77 may be exposed. Subsequently, conductive layers 81 may be formed in the second openings OP2.

According to the above-described manufacturing method, memory cells including the ferroelectric patterns 74A, respectively, may be formed.

Figure 12A:
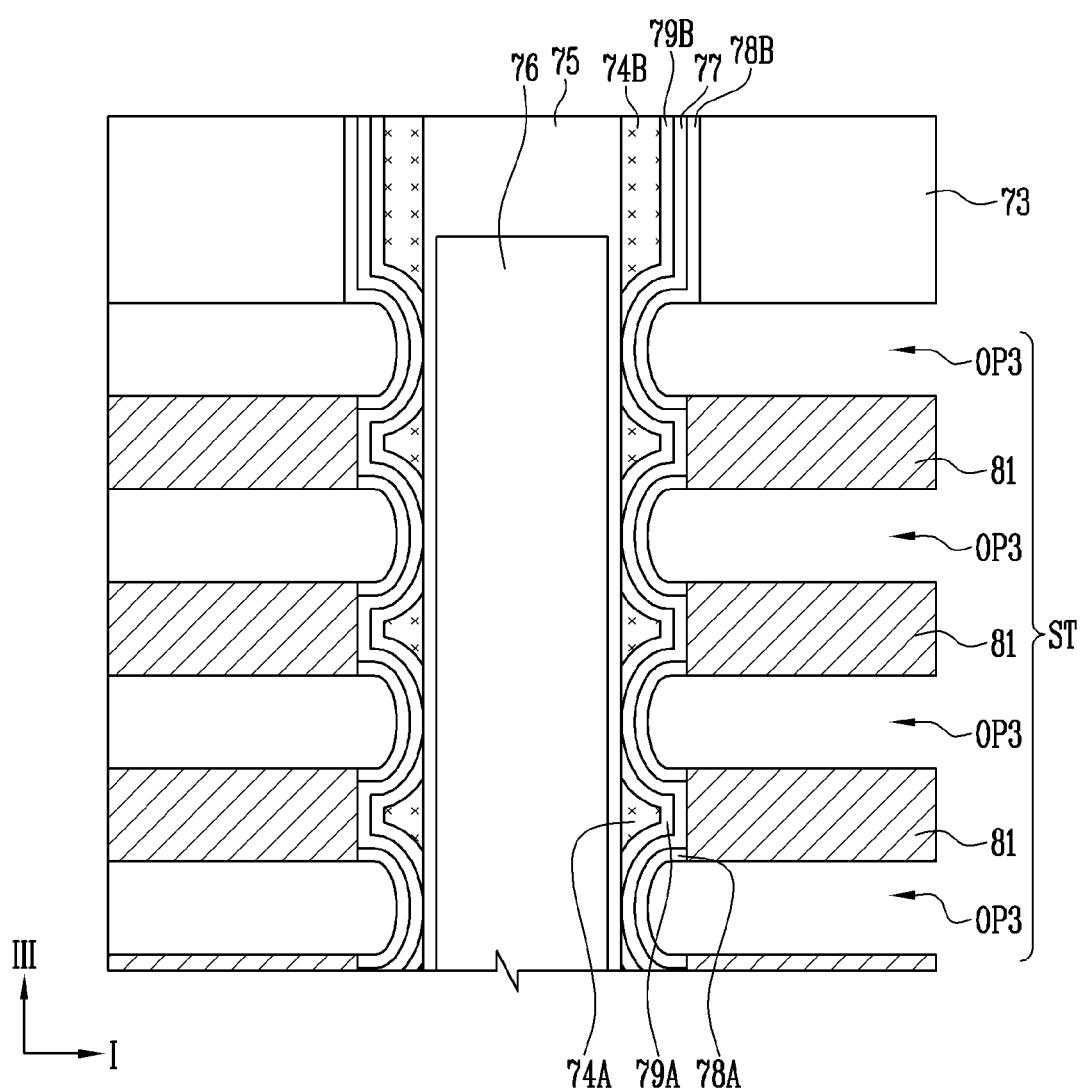
FIGS. 12A to 12C are diagrams, illustrating a method of manufacturing a semiconductor device, according to an embodiment of the present disclosure.
Figure 12B:
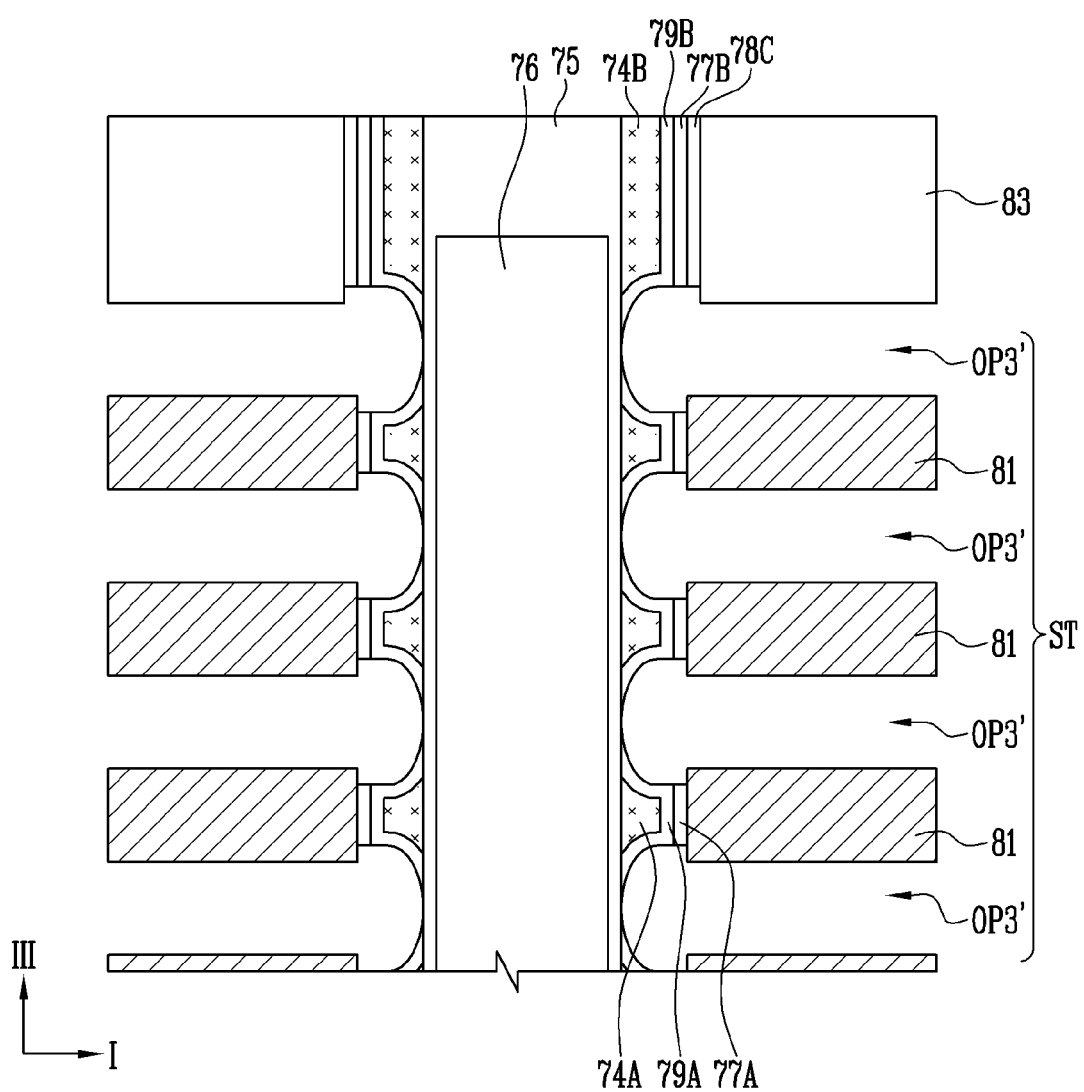
Figure 12C:
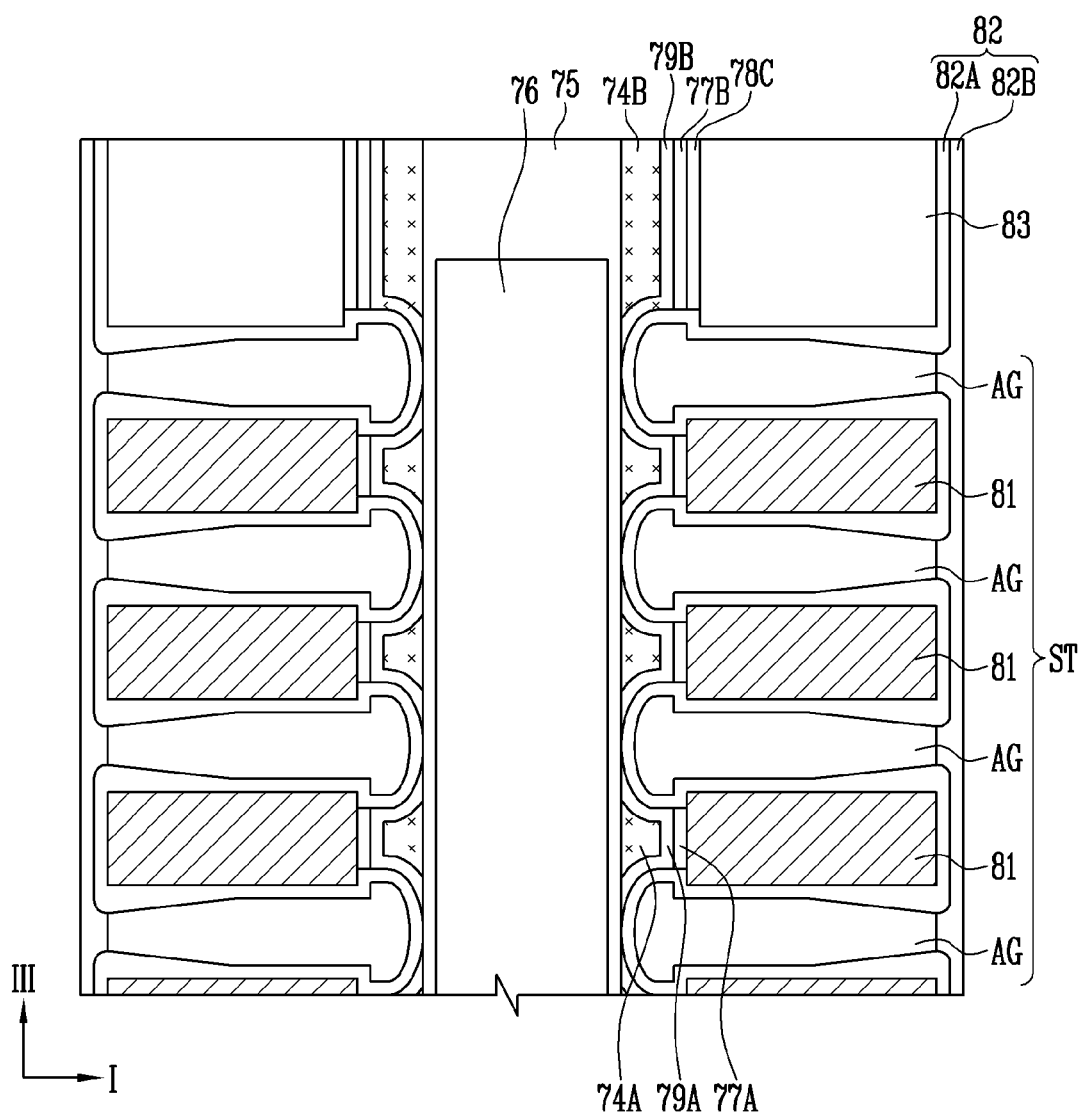

FIGS. 12A to 12C are diagrams, illustrating a method of manufacturing a semiconductor device, according to an embodiment of the present disclosure. Hereinafter, any repetitive detailed description of components that have already been mentioned above will be omitted.

FIGS. 12A to 12C are views, illustrating performed processes subsequent to the manufacturing processes as described above with reference to FIGS. 11A to 11D. Referring to FIG. 12A, the third openings OP3 may be formed by selectively etching the second material layers 72 through the slit SL. The second material layers 72 may be etched under the condition that the second material layers 72 have a high etch selectivity with respect to the sacrificial patterns 78A and 78B and the conductive layers 81.

Referring to FIG. 12B, the sacrificial patterns 78A and 78B and the first dielectric layer 77 may be etched through the third openings OP3. As a result, the channel layer 75 may be exposed, and a sacrificial pattern 78C and first dielectric patterns 77A and 77B may be formed. As a result, the third openings OP3' may extend toward the channel layer 75.

Subsequently, the second dielectric patterns 79A and 79B, or the second dielectric patterns 79A and 79B and the ferroelectric patterns 74A and 74B may be etched through the third openings OP3. As a result, the third openings OP3' may further extend toward the channel layer 75. In addition, even though the ferroelectric patterns 74A and 74B are not completely separated during the etching of the ferroelectric layer 74, the ferroelectric patterns 74A and 74B may be completely separated by additionally etching the ferroelectric layer 74.

Referring to FIG. 12C, by forming a sealing layer 82, the air gaps AG that are located in the third openings OP3', respectively, may be formed. The sealing layer 82 may include either or both of a first sealing layer 82A and a second sealing layer 82B.

According to the above-described manufacturing method, memory cells including the ferroelectric patterns 74A, respectively, may be formed. In addition, the air gaps AG that are located in the conductive layers 81 and that extend between the ferroelectric patterns 74A may be formed.

Figure 13A:
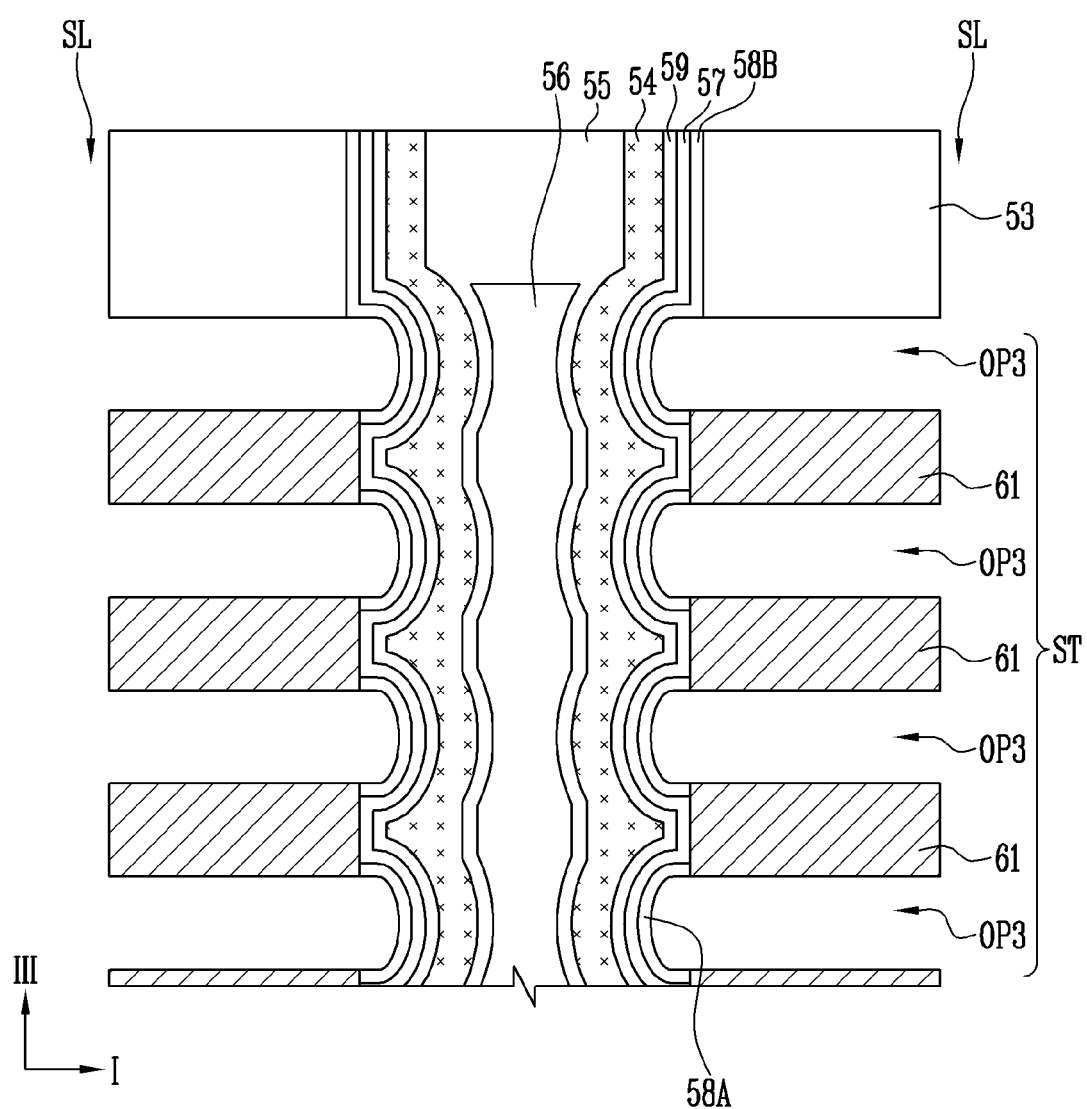
FIGS. 13A and 13B are diagrams, illustrating a method of manufacturing a semiconductor device, according to an embodiment of the present disclosure.
Figure 13B:
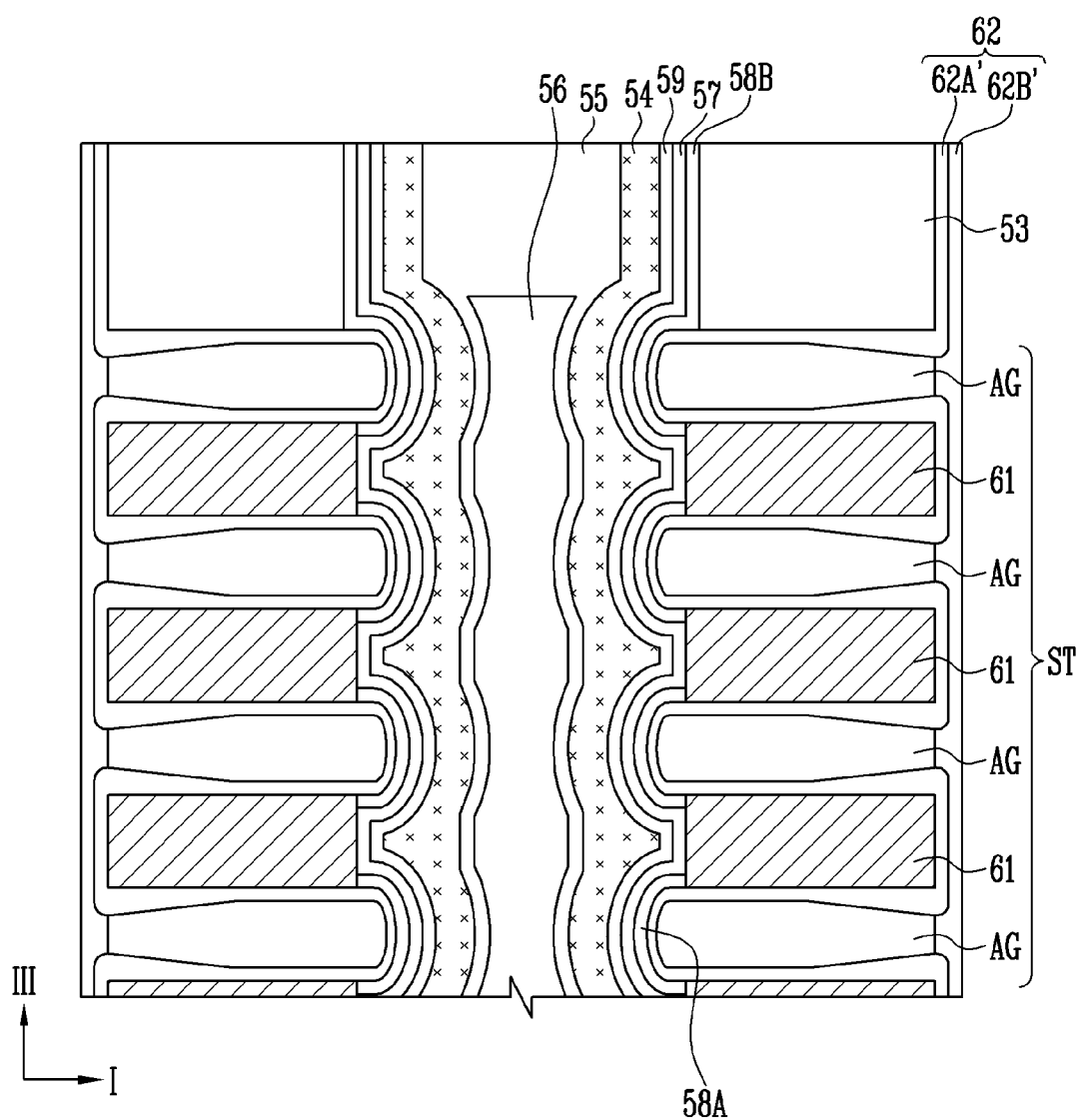

FIGS. 13A and 13B are diagrams, illustrating a method of manufacturing a semiconductor device, according to an embodiment of the present disclosure. Hereinafter, any repetitive detailed description of components that have already been mentioned above will be omitted.

FIGS. 13A and 13B are views, illustrating performed processes subsequent to the manufacturing processes as described above with reference to FIGS. 9A to 9E. Referring to FIG. 13A, the third openings OP3 may be formed by selectively etching the second material layers 52 through the slit SL. The second material layers 52 may be etched under the condition that the second material layers 52 include a material with a high etch selectivity with respect to the sacrificial patterns 58A and 58B and the conductive layers 61. Therefore, the first dielectric layer 57 may be protected by the sacrificial patterns 58A and 58B.

Referring to FIG. 13B, a sealing layer 62' may be formed so that the air gaps AG that are located in the third openings OP3, respectively, may be formed. The sealing layer 62' may include either or both of a first sealing layer 62A' and a second sealing layer 62B'. The sacrificial patterns 58A and 58B may be etched before the sealing layer 62' is formed.

However, the processes as described above with reference to FIGS. 13A and 13B may be performed after the manufacturing processes as described above with reference to FIGS. 11A to 11D. In addition, the embodiments described in the present disclosure may be combined with each other.

Figure 14:
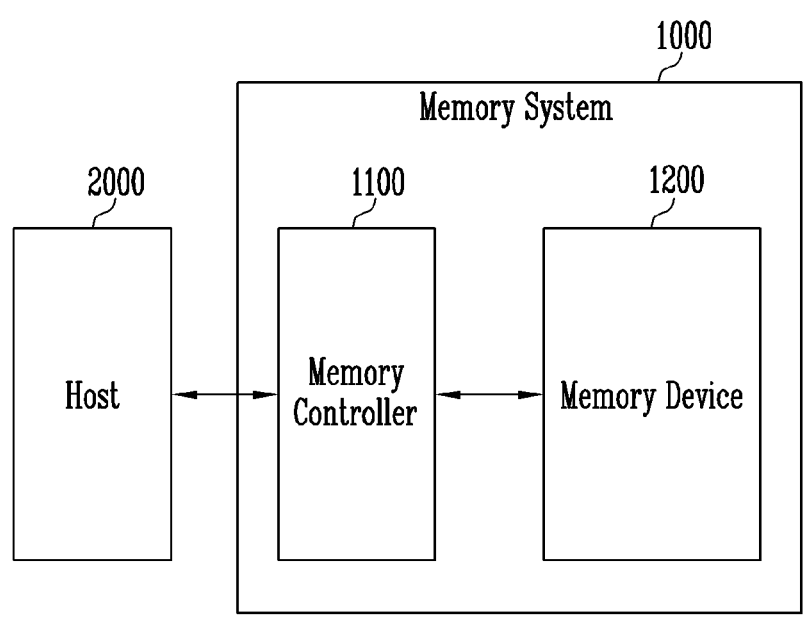
FIG. 14 is a diagram, illustrating a memory system, according to an embodiment of the present disclosure.

FIG. 14 is a diagram, illustrating a memory system 1000, according to an embodiment of the present disclosure.

Referring to FIG. 14, the memory system 1000 may include a memory device 1200 configured to store data and a controller 1100 performing communications between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 by using at least one interface protocol among Peripheral Component Interconnect Express (PCIe), Advanced Technology Attachment (ATA), Serial ATA (SATA), Parallel ATA (PATA), Serial Attached SCSI (SAS), Non-Volatile Memory express (NVMe), Universal Serial Bus (USB), Multi-Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control overall operations of the memory system 1000. The controller 1100 may control the memory device 1200 in response to the requests of the host 2000. The controller 1100 may control the memory device 1200 to perform a program operation, a read operation and an erase operation at the request of the host 2000. Alternatively, the controller 1100 may perform a background operation for performance improvement of the memory system 1000 in the absence of the request from the host 2000.

To control the operations of the memory device 1200, the controller 1100 may transfer a control signal and a data signal to the memory device 1200. The control signal and the data signal may be transferred to the memory device 1200 through different input/output lines. The data signal may include a command, an address, or data. The control signal may be used to differentiate periods in which the data signal is input.

The memory device 1200 may perform a program operation, a read operation and an erase operation in response to control of the controller 1100. The memory device 1200 may be a volatile memory that loses data when power supply is blocked, or a non-volatile memory that retains data in the absence of power supply. According to an embodiment, the memory device 1200 may be the above-descried semiconductor device, which may be a flash memory device.

At the request for a program, read, or erase operation from the host 2000, the controller 1100 may command the memory device 1200 which has the structure as described above with reference to FIG. 1A to 8B, or which is manufactured by the method as described with reference to FIGS. 9A to 13B to perform a program, read, or erase operation. In this manner, cell performance characteristics and retention characteristics may be improved.

Figure 15:
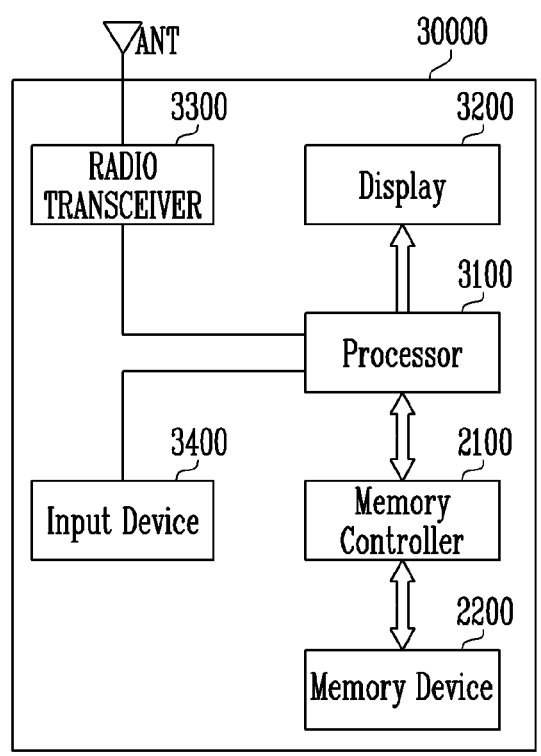
FIG. 15 is a diagram, illustrating a memory system, according to an embodiment of the present disclosure.

FIG. 15 is a diagram, illustrating a memory system 30000, according to an embodiment of the present disclosure.

Referring to FIG. 15, the memory system 30000 may be embodied into a cellular phone, a smart phone, a tablet, a personal computer (PC), a personal digital assistant (PDA), or a wireless communication device. The memory system 30000 may include a memory device 2200 and a controller 2100 controlling the operations of the memory device 2200.

The controller 2100 may control a data access operation of the memory device 2200, for example, a program operation, an erase operation or a read operation of the memory device 2200 in response to control of a processor 3100.

The data programmed into the memory device 2200 may be output through a display 3200 in response to control of the controller 2100.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the controller 2100 or the display 3200. The controller 2100 may transfer the signal processed by the processor 3100 into the memory device 2200. In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the controller 2100, data output from the radio transceiver 3300, or data output from an input device 3400 may be output through the display 3200.

According to an embodiment, the controller 2100 capable of controlling the operations of the memory device 2200 may be realized as a portion of the processor 3100, or as a separate chip from the processor 3100.

Figure 16:
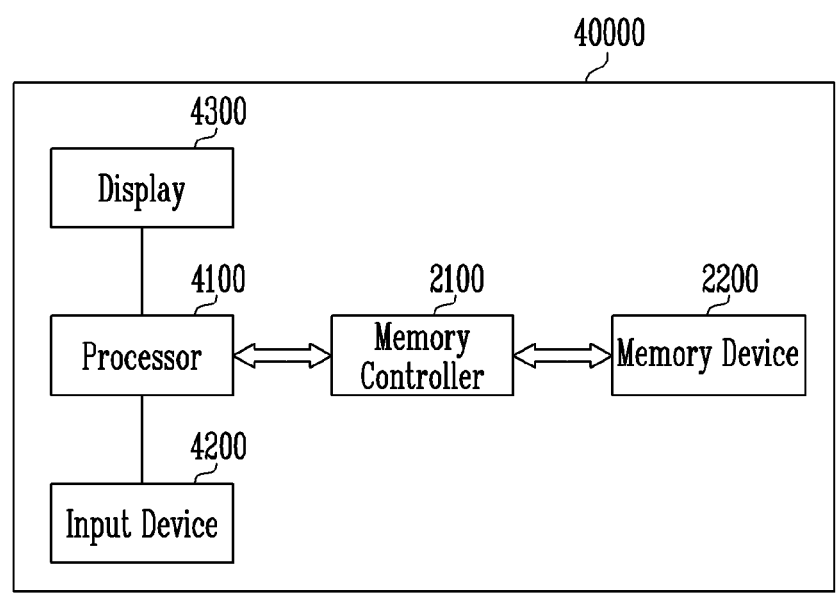
FIG. 16 is a diagram, illustrating a memory system, according to an embodiment of the present disclosure.

FIG. 16 is a diagram, illustrating a memory system 40000, according to an embodiment of the present disclosure.

Referring to FIG. 16, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the controller 2100 controlling a data processing operation of the memory device 2200.

A processor 4100 may output data stored in the memory device 2200 through a display 4300 according to data input through an input device 4200. Examples of the input device 4200 may include a pointing device, such as a touch pad or a computer mouse, a keypad, or a keyboard.

The processor 4100 may control overall operations of the memory system 40000 and control operations of the controller 2100. According to an embodiment, the controller 2100 capable of controlling the operations of the memory device 2200 may be realized as a portion of the processor 4100, or as a separate chip from the processor 4100.

Figure 17:
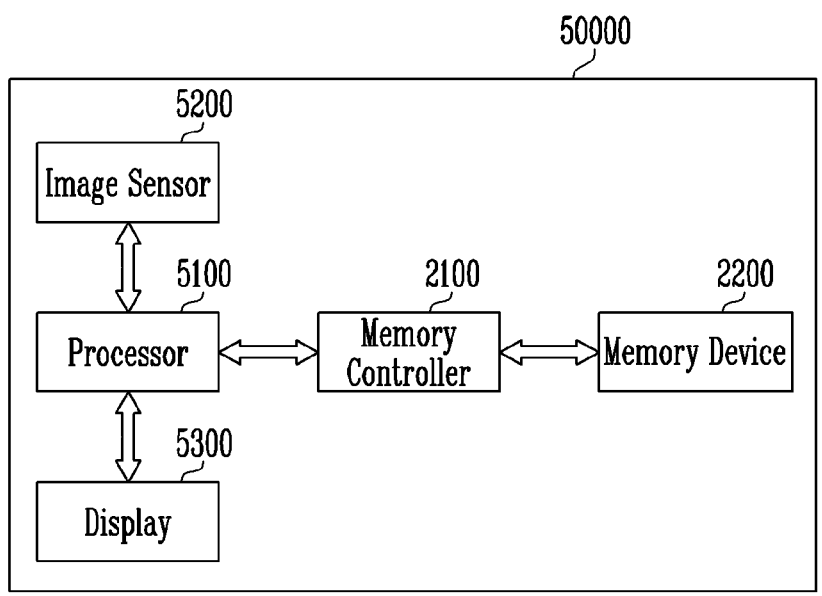
FIG. 17 is a diagram, illustrating a memory system, according to an embodiment of the present disclosure.

FIG. 17 is a diagram, illustrating a memory system 50000, according to an embodiment of the present disclosure.

Referring to FIG. 17, the memory system 50000 may be embodied into an image processor, for example, a digital camera, a cellular phone with a digital camera attached thereto, a smart phone with a digital camera attached thereto, or a table PC with a digital camera attached thereto.

The memory system 50000 may include the memory device 2200 and the controller 2100 controlling a data processing operation of the memory device 2200, for example, a program operation, an erase operation, or a read operation.

An image sensor 5200 of the memory system 50000 may convert an optical image into digital signals. The converted digital signals may be transferred to a processor 5100 or the controller 2100. In response to control of the processor 5100, the converted digital signals may be output through a display 5300 or stored in the memory device 2200 through the controller 2100. In addition, the data stored in the memory device 2200 may be output through the display 5300 in response to control of the processor 5100 or the controller 2100.

According to an embodiment, the controller 2100 capable of controlling the operations of the memory device 2200 may be formed as a part of the processor 5100, or a separate chip from the processor 5100.

Figure 18:
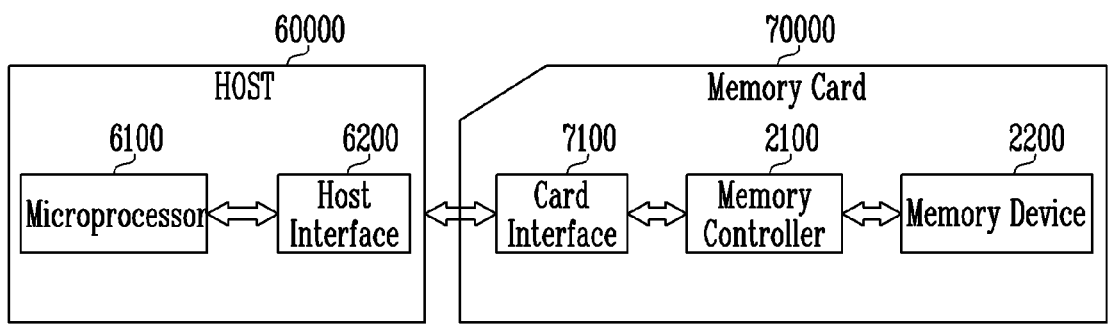
FIG. 18 is a diagram, illustrating a memory system, according to an embodiment of the present disclosure.

FIG. 18 is a diagram, illustrating a memory system 70000, according to an embodiment of the present disclosure.

Referring to FIG. 18, the memory system 70000 may include a memory card or a smart card. The memory system 70000 may include the memory device 2200, the controller 2100, and a card interface 7100.

The controller 2100 may control data exchange between the memory device 2200 and the card interface 7100. According to an embodiment, the card interface 7100 may be, but not limited thereto, a secure digital (SD) card interface or a multi-media card (MMC) interface.

The card interface 7100 may interface data exchange between a host 60000 and the controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to a host interface 6200 of the host 60000, such as a PC, a tablet PC, a digital camera, a digital audio player, a cellular phone, a console video game hardware, or a digital set-top box, the host interface 6200 may perform data communication with the memory device 2200 through the card interface 7100 and the controller 2100 in response to control of a microprocessor 6100.

According to embodiments of the invention, a semiconductor device with a stabilized structure and improved reliability may be provided.

What is claimed is:

1. A semiconductor device, comprising:
   a stacked structure with conductive layers and insulating layers that are stacked alternately with each other;
   a channel layer passing through the stacked structure;
   a ferroelectric layer surrounding a sidewall of the channel layer;
   a first dielectric layer surrounding a sidewall of the ferroelectric layer; and
   sacrificial patterns interposed between the first dielectric layer and the insulating layers, the sacrificial patterns including a material with a higher dielectric constant than the first dielectric layer.

2. The semiconductor device of claim 1, wherein each of the insulating layers comprises a first portion interposed between the conductive layers and a second portion that protrudes further toward the channel layer than the conductive layers.

3. The semiconductor device of claim 2, wherein the second portion has a rounded edge.

4. The semiconductor device of claim 1, wherein the ferroelectric layer includes grooves on a sidewall thereof, and
wherein the grooves are located at levels that correspond to the insulating layers.

5. The semiconductor device of claim 1, further comprising a second dielectric layer interposed between the first dielectric layer and the ferroelectric layer, the second dielectric layer with a material that has a higher dielectric constant than the first dielectric layer.

6. The semiconductor device of claim 1, further comprising a second dielectric layer interposed between the first dielectric layer and the ferroelectric layer, the second dielectric layer with a material that has a larger band gap than the ferroelectric layer.

7. The semiconductor device of claim 1, further comprising a third dielectric layer interposed between the ferroelectric layer and the channel layer, the third dielectric layer with a material that has a higher dielectric constant than the first dielectric layer.

8. The semiconductor device of claim 1, further comprising a third dielectric layer interposed between the ferroelectric layer and the channel layer, the third dielectric layer with a material that has a larger band gap than the ferroelectric layer.

9. The semiconductor device of claim 1, where each of the insulating layers includes an air gap.

10. The semiconductor device of claim 1, wherein the ferroelectric layer includes ferroelectric patterns that are interposed between the channel layer and the conductive layers, the ferroelectric patterns being separated from each other.

11. The semiconductor device of claim 1, wherein the first dielectric layer includes a material with a larger band gap than the ferroelectric layer.

* * * * *